(12) United States Patent
Tarsa et al.

(10) Patent No.: US 8,564,004 B2
(45) Date of Patent: Oct. 22, 2013

(54) COMPLEX PRIMARY OPTICS WITH INTERMEDIATE ELEMENTS

(75) Inventors: Eric Tarsa, Goleta, CA (US); Bernd Keller, Santa Barbara, CA (US); Peter Guschl, Carpinteria, CA (US); Gerald Negley, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/306,589

(22) Filed: Nov. 29, 2011

(65) Prior Publication Data

US 2013/0134445 A1    May 30, 2013

(51) Int. Cl.
*H01L 33/00*    (2010.01)

(52) U.S. Cl.
USPC .............. 257/98; 257/89; 257/99; 257/100; 257/E21.592

(58) Field of Classification Search
USPC .............. 257/79, 82, 98–100, 432–434, 672
See application file for complete search history.

(56) References Cited

U.S. PATENT DOCUMENTS

| | | | |
|---|---|---|---|
| 3,760,237 A | 9/1973 | Jaffe | 257/98 |
| 4,307,297 A | 12/1981 | Groff | |
| 4,322,735 A | 3/1982 | Sadamasa et al. | |
| 4,511,425 A | 4/1985 | Boyd | 156/493 |
| 4,946,547 A | 8/1990 | Palmour et al. | 156/643 |
| 5,040,868 A | 8/1991 | Waitl | |
| 5,122,943 A | 6/1992 | Pugh | 362/256 |
| 5,130,761 A | 7/1992 | Tanaka | 357/17 |
| 5,167,556 A | 12/1992 | Stein | |
| 5,200,022 A | 4/1993 | Kong et al. | 156/612 |
| 5,351,106 A | 9/1994 | Lesko | 355/83 |
| RE34,861 E | 2/1995 | Davis et al. | 437/100 |
| 5,703,401 A | 12/1997 | Van de Water | |
| 5,706,177 A | 1/1998 | Nather | |
| 5,790,298 A | 8/1998 | Tonar | 359/267 |
| 5,813,753 A | 9/1998 | Vriens et al. | 362/293 |
| 5,907,151 A | 5/1999 | Gramann | |
| 5,959,316 A | 9/1999 | Lowery | 257/98 |
| 6,061,160 A | 5/2000 | Maruyama | 359/152 |
| 6,066,861 A | 5/2000 | Hohn et al. | |
| 6,183,100 B1 | 2/2001 | Suckow et al. | 362/35 |
| 6,224,216 B1 | 5/2001 | Parker et al. | 353/31 |

(Continued)

FOREIGN PATENT DOCUMENTS

| | | |
|---|---|---|
| CN | 1274906 A | 11/2000 |
| CN | 1417868 A | 5/2003 |

(Continued)

OTHER PUBLICATIONS

First Office Action from Chinese Patent Application No. 201080001658.4, dated Sep. 24, 2012.

(Continued)

*Primary Examiner* — Dung A. Le
(74) *Attorney, Agent, or Firm* — Koppel, Patrick, Heybl & Philpott

(57) ABSTRACT

A light emitter package comprising a light emitter disposed on a surface and a primary optic comprising an encapsulant disposed over the light emitter is disclosed. The package further comprises at least one intermediate element on the surface and at least partially surrounding the light emitter such that the intermediate element at least partially defines the shape of the primary optic. The intermediate element is configured so at least a portion of the intermediate element can be removed.

27 Claims, 12 Drawing Sheets

(56) References Cited

U.S. PATENT DOCUMENTS

| | | | |
|---|---|---|---|
| 6,259,608 B1 | 7/2001 | Berardinelli et al. | 361/777 |
| 6,274,924 B1 | 8/2001 | Carey et al. | 257/676 |
| 6,296,367 B1 | 10/2001 | Parsons et al. | 362/183 |
| 6,359,236 B1 | 3/2002 | DiStefano et al. | 374/261 |
| 6,376,902 B1 | 4/2002 | Arndt | 257/678 |
| 6,454,437 B1 | 9/2002 | Kelly | 362/246 |
| 6,469,321 B2 | 10/2002 | Arndt | |
| 6,480,389 B1 | 11/2002 | Shie et al. | 361/707 |
| 6,517,218 B2 | 2/2003 | Hochstein | 362/294 |
| 6,536,913 B1 | 3/2003 | Yajoma | |
| 6,573,580 B2 | 6/2003 | Arndt | |
| 6,610,563 B1 | 8/2003 | Waitl | |
| 6,614,058 B2 | 9/2003 | Lin et al. | |
| 6,624,491 B2 | 9/2003 | Waitl et al. | |
| 6,680,490 B2 | 1/2004 | Yasukawa et al. | |
| 6,686,609 B1 | 2/2004 | Sung | |
| 6,707,069 B2 | 3/2004 | Song et al. | 257/79 |
| 6,710,373 B2 | 3/2004 | Wang | 257/79 |
| 6,759,733 B2 | 7/2004 | Arndt | |
| 6,770,498 B2 | 8/2004 | Hsu | 438/26 |
| 6,774,401 B2 | 8/2004 | Nakada et al. | |
| 6,858,879 B2 | 2/2005 | Waitl | |
| 6,872,585 B2 | 3/2005 | Matsumura et al. | |
| 6,876,149 B2 | 4/2005 | Miyashita | |
| 6,900,511 B2 | 5/2005 | Ruhnau et al. | |
| 6,911,678 B2 | 6/2005 | Fujisawa et al. | |
| 6,919,586 B2 | 7/2005 | Fujii | |
| 6,940,704 B2 | 9/2005 | Stalions | |
| 6,946,714 B2 | 9/2005 | Waitl | |
| 6,975,011 B2 | 12/2005 | Arndt | |
| 6,995,510 B2 | 2/2006 | Murakami et al. | 313/512 |
| 7,009,285 B2 | 3/2006 | Su et al. | 257/680 |
| 7,009,627 B2 | 3/2006 | Abe et al. | 345/690 |
| 7,021,797 B2 | 4/2006 | Minano et al. | 362/355 |
| 7,064,907 B2 | 6/2006 | Kaneko | |
| 7,066,626 B2 | 6/2006 | Omata | |
| 7,102,213 B2 | 9/2006 | Sorg | |
| 7,102,215 B2 | 9/2006 | Arndt | 257/672 |
| 7,119,422 B2 | 10/2006 | Chin | 257/666 |
| 7,161,189 B2 | 1/2007 | Wu | 57/98 |
| 7,183,632 B2 | 2/2007 | Arndt | 257/672 |
| 7,213,940 B1 | 5/2007 | Van De Ven et al. | |
| 7,224,000 B2 | 5/2007 | Aanegola et al. | 257/98 |
| 7,271,425 B2 | 9/2007 | Arndt et al. | 257/99 |
| 7,282,740 B2 | 10/2007 | Chikugawa et al. | 257/79 |
| 7,282,785 B2 | 10/2007 | Yoshida | 257/666 |
| 7,285,802 B2 | 10/2007 | Ouderkirk et al. | 257/98 |
| 7,286,926 B2 | 10/2007 | Gotoh et al. | |
| 7,317,181 B2 | 1/2008 | Murakami et al. | 250/214.1 |
| D572,670 S | 7/2008 | Lee | D13/180 |
| D572,670 S | 7/2008 | Ono et al. | D13/180 |
| D576,574 S | 9/2008 | Kobayakawa | D13/180 |
| 7,436,002 B2 | 10/2008 | Brunner et al. | 257/99 |
| 7,635,915 B2 | 12/2009 | Xie et al. | 257/692 |
| 7,777,412 B2 | 8/2010 | Pang | 313/506 |
| 2002/0030194 A1 | 3/2002 | Camras et al. | |
| 2002/0061174 A1 | 5/2002 | Hurt et al. | |
| 2002/0066905 A1 | 6/2002 | Wang | |
| 2002/0123163 A1 | 9/2002 | Fujii | |
| 2002/0130405 A1 | 9/2002 | Kobayashi et al. | |
| 2002/0163001 A1 | 11/2002 | Shaddock | |
| 2002/0195935 A1 | 12/2002 | Jager | |
| 2003/0116769 A1 | 6/2003 | Song et al. | |
| 2003/0183852 A1 | 10/2003 | Takenaka | |
| 2004/0041222 A1 | 3/2004 | Loh | |
| 2004/0047151 A1 | 3/2004 | Bogner et al. | |
| 2004/0079957 A1 | 4/2004 | Andrews et al. | |
| 2004/0080939 A1 | 4/2004 | Braddell et al. | |
| 2004/0126913 A1 | 7/2004 | Loh | |
| 2004/0201028 A1 | 10/2004 | Waitl | |
| 2004/0227149 A1 | 11/2004 | Ibbetson | |
| 2004/0232435 A1 | 11/2004 | Hofer | |
| 2004/0238930 A1 | 12/2004 | Arndt | |
| 2004/0256706 A1 | 12/2004 | Nakashima | |
| 2005/0023548 A1 | 2/2005 | Bhat | |
| 2005/0072981 A1 | 4/2005 | Suenaga | |
| 2005/0077535 A1 | 4/2005 | Li | |
| 2005/0093005 A1 | 5/2005 | Ruhnau | |
| 2005/0117320 A1 | 6/2005 | Leu et al. | |
| 2005/0127377 A1 | 6/2005 | Arndt | |
| 2005/0135105 A1 | 6/2005 | Teixeira et al. | |
| 2005/0152127 A1 | 7/2005 | Kamiya et al. | |
| 2005/0156187 A1 | 7/2005 | Isokawa | |
| 2005/0179041 A1 | 8/2005 | Harbers et al. | |
| 2005/0179376 A1 | 8/2005 | Fung et al. | |
| 2005/0231983 A1 | 10/2005 | Dahm | |
| 2005/0253130 A1* | 11/2005 | Tsutsumi et al. | 257/13 |
| 2006/0022212 A1 | 2/2006 | Waitl | |
| 2006/0049477 A1 | 3/2006 | Arndt et al. | |
| 2006/0102917 A1 | 5/2006 | Oyama et al. | |
| 2006/0108594 A1 | 5/2006 | Iwasaki et al. | |
| 2006/0133044 A1 | 6/2006 | Kim et al. | |
| 2006/0151809 A1 | 7/2006 | Isokawa | |
| 2006/0157828 A1 | 7/2006 | Sorg | |
| 2006/0220046 A1 | 10/2006 | Yu et al. | |
| 2007/0046176 A1 | 3/2007 | Bukesov et al. | |
| 2007/0050530 A1 | 3/2007 | Rajan | |
| 2007/0096139 A1 | 5/2007 | Schultz | |
| 2007/0109779 A1 | 5/2007 | Sekiguchi et al. | |
| 2007/0145401 A1 | 6/2007 | Ikehara | |
| 2007/0170449 A1 | 7/2007 | Anandan | |
| 2007/0252250 A1 | 11/2007 | Hui et al. | |
| 2007/0269586 A1 | 11/2007 | Leatherdale | |
| 2008/0013319 A1 | 1/2008 | Pei et al. | |
| 2008/0026498 A1* | 1/2008 | Tarsa et al. | 438/26 |
| 2008/0074032 A1* | 3/2008 | Yano et al. | 313/503 |
| 2008/0093606 A1 | 4/2008 | Pan et al. | |
| 2008/0121921 A1 | 5/2008 | Loh et al. | |
| 2008/0170391 A1 | 7/2008 | Norfidathul et al. | 362/227 |
| 2008/0186702 A1 | 8/2008 | Camras et al. | |
| 2008/0191232 A1 | 8/2008 | Lee et al. | |
| 2008/0198594 A1 | 8/2008 | Lee | |
| 2008/0296590 A1 | 12/2008 | Ng | |
| 2008/0303052 A1 | 12/2008 | Lee et al. | |
| 2009/0050908 A1 | 2/2009 | Yuan et al. | |
| 2009/0072251 A1 | 3/2009 | Chan et al. | |
| 2009/0129085 A1 | 5/2009 | Aizar et al. | |
| 2009/0189178 A1 | 7/2009 | Kim et al. | |
| 2009/0283781 A1 | 11/2009 | Chan et al. | |
| 2010/0044735 A1 | 2/2010 | Oyamada | |
| 2010/0193822 A1* | 8/2010 | Inobe et al. | 257/98 |
| 2011/0049545 A1 | 3/2011 | Basin et al. | 257/98 |
| 2011/0108874 A1 | 5/2011 | Chu et al. | |
| 2011/0186880 A1* | 8/2011 | Kohler et al. | 257/91 |
| 2011/0193118 A1 | 8/2011 | Oshima et al. | |
| 2011/0278617 A1 | 11/2011 | Lee | |

FOREIGN PATENT DOCUMENTS

| | | |
|---|---|---|
| CN | 2617039 Y | 5/2004 |
| CN | 1581527 A | 2/2005 |
| CN | 1591924 A | 3/2005 |
| CN | 1679168 A | 10/2005 |
| CN | 1720608 A | 1/2006 |
| CN | 1744335 A | 3/2006 |
| CN | 1874011 A | 6/2006 |
| CN | 1913135 A | 2/2007 |
| CN | 1977399 A | 6/2007 |
| CN | 101005109 A | 7/2007 |
| CN | 101360368 | 2/2009 |
| EP | 1005085 A2 | 5/2000 |
| EP | 1005085 A3 | 12/2000 |
| EP | 1187226 | 3/2002 |
| EP | 1187227 | 3/2002 |
| EP | 1187228 | 3/2002 |
| EP | 1418630 A1 | 5/2004 |
| EP | 1521313 | 4/2005 |
| EP | 1538680 A2 | 6/2005 |
| EP | 1864780 | 12/2007 |
| EP | 1953834 A1 | 8/2008 |
| GB | 2420221 A | 12/2004 |
| GB | 2420221 A | 5/2006 |
| GB | 2458972 A | 10/2009 |
| GB | 2466633 A | 7/2010 |

(56) References Cited

FOREIGN PATENT DOCUMENTS

| | | |
|---|---|---|
| JP | 53118019 | 10/1978 |
| JP | S53118019 | 10/1978 |
| JP | 5927559 A | 2/1984 |
| JP | 59027559 | 2/1984 |
| JP | 6148951 A | 3/1986 |
| JP | 61048951 | 3/1986 |
| JP | 7202271 A | 8/1995 |
| JP | 08032120 | 2/1996 |
| JP | 8139257 | 5/1996 |
| JP | 10321909 | 12/1998 |
| JP | 11008405 | 1/1999 |
| JP | 11054802 | 2/1999 |
| JP | 11150306 | 6/1999 |
| JP | 11261113 | 9/1999 |
| JP | 2000188358 | 7/2000 |
| JP | 2000223751 | 8/2000 |
| JP | 2001044506 | 2/2001 |
| JP | 2001168400 | 6/2001 |
| JP | 2001518692 | 10/2001 |
| JP | 2002223005 | 8/2002 |
| JP | 2003197974 | 7/2003 |
| JP | 2003264267 | 9/2003 |
| JP | 2004103775 | 2/2004 |
| JP | 2004146815 | 5/2004 |
| JP | 2004200236 | 7/2004 |
| JP | 2004335740 | 11/2004 |
| JP | 200519838 A | 1/2005 |
| JP | 2005019838 | 1/2005 |
| JP | 2005079167 | 3/2005 |
| JP | 2005150624 | 6/2005 |
| JP | 2005310935 | 11/2005 |
| JP | 2006509372 A | 3/2006 |
| JP | 2006119357 | 5/2006 |
| JP | 200795797 A | 4/2007 |
| JP | 2007094088 | 4/2007 |
| JP | 2007165029 | 6/2007 |
| JP | 2007184542 | 7/2007 |
| JP | 2007329516 | 12/2007 |
| JP | 2008521236 | 6/2008 |
| JP | 2000223752 | 8/2008 |
| JP | 2004111937 A | 4/2011 |
| WO | WO 9931737 | 6/1999 |
| WO | WO 0217405 | 2/2002 |
| WO | WO 03049204 | 6/2003 |
| WO | WO 2004027882 | 1/2004 |
| WO | WO 2004044877 | 5/2004 |
| WO | WO 2004053933 A2 | 6/2004 |
| WO | WO 2005043627 A1 | 5/2005 |
| WO | WO 2005104247 | 11/2005 |
| WO | WO 2006016398 | 2/2006 |
| WO | WO 2006054228 A2 | 5/2006 |
| WO | WO 2006054228 A3 | 5/2006 |
| WO | WO 2006054278 | 5/2006 |
| WO | WO 2006054228 | 6/2006 |
| WO | WO 2007122516 | 11/2007 |
| WO | WO 2007127029 A2 | 11/2007 |
| WO | WO 2008082098 | 7/2008 |
| WO | WO 2010005294 | 1/2010 |

OTHER PUBLICATIONS

First Office Action for Chinese Patent Application No. CN 200710152109.7 issued Jul. 29, 2011.
Second Office Action for Chinese Patent Appl. No. CN 200880009255.7 mailed Oct. 13, 2011.
Extended Supplementary European Search Report for EP Application No. EP07789665.2 dated Nov. 7, 2011.
International Search Report and Written Opinion for PCT Appl. No. PCT/US2011/001457 mailed Dec. 13, 2011.
Office Action from U.S. Appl. No. 12/291,293, dated: Jul. 19, 2011.
Response to Office Action from U.S. Appl. No. 12/291,293, OA dated: Jul. 19, 2011, Resp. dated: Oct. 19, 2011.
Office Action from U.S. Appl. No. 11/465,120, dated: Jun. 14, 2011.
Office Action from U.S. Appl. No. 12/069,827, dated: Jun. 16, 2011.
Response to Office Action from U.S. Appl. No. 12/069,827, OA dated: Jul. 16, 2011, Resp. dated: Aug. 3, 2011.
Office Action from U.S. Appl. No. 12/321,059, dated: Jun. 22, 2011.
Response to Office Action from U.S. Appl. No. 12/321,059, OA dated: Jun. 22, 2011, Resp. dated: Aug. 22, 2011.
Office Action from U.S. Appl. No. 12/321,059, dated: Aug. 26, 2011.
Response to Office Action from U.S. Appl. No. 12/321,059, OA dated: Jun. 22, 2011, Resp. dated: Sep. 20, 2011.
Office Action from U.S. Appl. No. 11/496,922, dated: Jul. 5, 2011.
Office Action from U.S. Appl. No. 12/695,978, dated: Sep. 14, 2011.
Office Action from U.S. Appl. No. 11/149,998, dated: Sep. 21, 2011.
Office Action from U.S. Appl. No. 12/321,059, dated: Oct. 4, 2011.
Office Action from U.S. Appl. No. 12/069,827, dated: Oct. 26, 2011.
Notice of Reasons for Rejection for Japanese Patent Appl. No. JP 2008-281533 dated Jun. 24, 2011.
Notice of Reasons for Rejection for Japanese Patent Appl. No. JP 2009-507195 dated Jun. 10, 2011.
Notice of Reasons for Rejection for Japanese Patent Appl. No. JP 2007-211901 dated Apr. 14, 2011.
Notice of Reasons for Rejection for Japanese Patent Appl. No. JP 2008-515699 dated May 19, 2011.
International Preliminary Report on Patentability for PCT/CN2010/070073 mailed Apr. 28, 2011.
International Search Report and Written Opinion for counterpart PCT Application No. PCT/CN2010/001865 mailed Jun. 9, 2011.
Office Action in related U.S. Appl. No. 12/002,410, dated: Apr. 26, 2011.
Office Action in related U.S. Appl. No. 12/002,410, dated: May 25, 2010.
Office Action in related U.S. Appl. No. 12/002,410, dated: Dec. 13, 2010.
Office Action in related U.S. Appl. No. 11/149,998, dated: May 11, 2011.
Office Action in related U.S. Appl. No. 11/149,998, dated: Aug. 27, 2010.
Office Action in related U.S. Appl. No. 11/149,998, dated: Jan. 24, 2011.
Office Action in related U.S. Appl. No. 11/149,998, dated: Nov. 20, 2009.
Response to OA in related U.S. Appl. No. 11/149,998, dated: Nov. 20, 2009, Response filed: Feb. 22, 2010.
Office Action in related U.S. Appl. No. 11/149,998, dated: May 18, 2010.
Office Action in related U.S. Appl. No. 12/291,293, dated: May 27, 2010.
Office Action in related U.S. Appl. No. 12/291,293, dated: Sep. 3, 2010.
Office Action in related U.S. Appl. No. 12/291,293, dated: Mar. 1, 2011.
Office Action in related U.S. Appl. No. 11/496,922, dated: Jun. 10, 2010.
Office Action in related U.S. Appl. No. 11/496,922, dated: Dec. 15, 2010.
Office Action in related U.S. Appl. No. 12/152,766, dated: Oct. 7, 2010.
Office Action in related U.S. Appl. No. 12/152,766, dated: Apr. 1, 2011.
Office Action in related U.S. Appl. No. 12/152,766, dated: Mar. 12, 2010.
Office Action in related U.S. Appl. No. 11/465,120, dated: Sep. 8, 2010.
Office Action in related U.S. Appl. No. 11/465,120, dated: Dec. 13, 2010.
Office Action in related U.S. Appl. No. 11/465,120, dated: Mar. 9, 2010.
Office Action in related U.S. Appl. No. 12/635,818, dated: Oct. 14, 2010.
Office Action in related U.S. Appl. No. 12/695,978, dated: Dec. 20, 2010.
Office Action in related U.S. Appl. No. 12/695,978, dated: May 10, 2011.
Office Action in related U.S. Appl. No. 12/069,827, dated: Oct. 29, 2010.

(56) References Cited

OTHER PUBLICATIONS

Office Action in related U.S. Appl. No. 12/069,827, dated: Apr. 20, 2010.
Office Action in related U.S. Appl. No. 12/069,827, dated Jan. 27, 2011.
Office Action in related U.S. Appl. No. 12/154,691, dated: Dec. 17, 2009.
Response to OA in related U.S. Appl. No. 12/154,691, dated: Dec. 17, 2009, Response filed: May 17, 2010.
Office Action in related U.S. Appl. No. 12/321,059, dated: May 17, 2010.
CREE® XLAMP® MC-E LEDs Product Info Sheets, pp. 1-3.
Nichia Corporation LEDs, Models NSSM016G, NSSM227, NESM026x, NSSM026BB, NESM005A, 9 Pages.
U.S. Appl. No. 11/656,759, filed Jan. 22, 2007, to Ashay Chitnis, et al.
U.S. Appl. No. 11/899,790, filed Sep. 7, 2007, to Ashay Chitnie, et al.
U.S. Appl. No. 11/473,089, filed Jun. 21, 2006, to Eric Tarsa, et al.
U.S. Appl. No. 11/380,402, filed Apr. 26, 2006, to Jian Hui Xie.
Office Action from related China Application No. 200710142310.7, dated: Dec. 11, 2009.
Related U.S. Appl. No. 11/473,089, filed Jun. 21, 2006, "Close Loop Electrophoretic Deposition of Semiconductor Devices".
Nichia Corp. White LED Part No. NSPW300BS, Specification for Nichia White LED , Model NSPW300BS., Jan. 14, 2004.
Nicha Corp., White LED Part No. NSPW312BS, Specification for Nichia White LED, Model NSPW312BS. Jan. 14, 2004.
Kim J.K et al. "Strongly Enhanced Phosphor Efficiency in GaInN White Light-Emitting Diodes Using Remote Phosphor Configuration and Diffuse Reflector Cup" Japanese Journal of Applied Physics, Japan Society of Applied Physics, Tokyo, JP, vol. 44, No. 20-23, Jan. 1, 2005 XP-001236966, pp. 649-651.
Preliminary Notice of Reasons for Refusal re related Japanese Application No. 2009-009-002857, dated: Jul. 24, 2009.
Related PCT International Search Report and Written Opinion, PCT/IB2007/002432, Date: Jan. 11, 2008.
International Search Report and Written Opinion for appl. No. PCT/CN2010/070073 mailed Apr. 15, 2010.
Japanese Patent Application 2001-60072, dated: Mar. 6, 2001.
Related Office Action from U.S. Appl. No. 11/277,717, dated: Jan. 6, 2009.
Related Office Action from related U.S. Appl. No. 11/277,717, dated Jul. 27, 2009.
Office Action from U.S. Appl. No. 11/149,998, dated: Nov. 20, 2009.
Response to Office Action from U.S. Appl. No. 11/149,998, dated: Feb. 22, 2010.
Office Action from U.S. Appl. No. 12/154,691, dated: Dec. 17, 2009.
Response to Office Action from U.S. Appl. No. 12/154,691, dated: May 17, 2010.
Office Action from U.S. Appl. No. 11/465,120, dated: Mar. 9, 2010.
Office Action from U.S. Appl. No. 12/152,766, dated: Mar. 12, 2010.
Office Action from U.S. Appl. No. 12/069,827, dated: Apr. 20, 2010.
Office Action from U.S. Appl. No. 11/149,998, dated: May 18, 2010.
Interrogation from Japanese Patent Application No. 2007-211901, dated Aug. 21, 2012.
Examination Report from European Patent Application No. 07789665.2, dated Aug. 20, 2012.
Decision of Rejection from Chinese Patent Application No. 200880009255.7, dated Sep. 5, 2012.
Office Action from U.S. Appl. No. 11/465,120, dated: Jun. 19, 2012.
Office Action from U.S. Appl. No. 11/982,275, dated: Jul. 9, 2012.
Office Action from U.S. Appl. No. 12/757,179, dated: Jul. 16, 2012.
Office Action from U.S. Appl. No. 11/465,120, mailed Dec. 9, 2011.
Office Action from U.S. Appl. No. 12/002,410, mailed Mar. 28, 2012.
Office Action from U.S. Appl. No. 12/002,410, mailed Dec. 21, 2011.
Response to Office Action for U.S. Appl. No. 12/002,410, filed Mar. 8, 2012.
Office Action from U.S. Appl. No. 12/757,179, mailed Jan. 19, 2012.
Office Action from U.S. Appl. No. 11/496,922, mailed Feb. 9, 2012.
Response to Office Action for U.S. Appl. No. 11/496,922, filed Apr. 6, 2012.
Advisory Action for U.S. Appl. No. 11/496,922, mailed Apr. 18, 2012.
Office Action from U.S. Appl. No. 12/321,059, mailed Feb. 10, 2012.
Response to Office Action for U.S. Appl. No. 12/321,059, filed Apr. 9, 2012.
Advisory Action from U.S. Appl. No. 12/321,059, mailed Apr. 20, 2012.
Office Action from U.S. Appl. No. 12/695,978, mailed Mar. 14, 2012.
Office Action from U.S. Appl. 11/982,275, mailed Mar. 23, 2012.
Office Action from U.S. Appl. 12/614,989, mailed Mar. 12, 2012.
Office Action from U.S. Appl. 12/069,827, mailed Apr. 3, 2012.
First Office Action for Chinese Patent Application No. 201110039138.9, dated Jun. 4. 2012.
Decision of Rejection from Japanese Patent Application No. 2008-515699, dated Jul. 17. 2012.
Decision of Rejection for Japanese Patent Application No. 2007-211901, dated: Jan. 30, 2012.
Notification of the First Office Action from Chinese Patent Application No. 201010167346.2, dated Feb. 29, 2012.
Notice of Reasons for Rejection from Japanese Patent Application No. 2009-507195, dated May 8, 2012.
First Office Action for Chinese Patent Application No. 200980153995.2 , dated May 4, 2012.
First Office Action for Chinese Patent Application No. 200910145412.3, dated Apr. 28, 2012.
Third Office Action from Chinese Patent Application No. 200710152109.7, dated: Mar. 5, 2013.
Interrogation from Japanese Patent Application No. 2008-515699, dated Feb. 19, 2013.
Extended Search Report for European Patent Application No. 09824413.0-1551, dated Feb. 11, 2013.
Second Office Action from Chinese Patent Appl. No. 201110039138.9, dated Jan. 31, 2013.
International Search Report and Written Opinion from PCT application No. PCT/US2012/065060, dated Feb. 20, 2013.
Communication from European Patent Appl. No. 09824413.0-1551, dated Feb. 28, 2013.
European Search Report from European Patent Appl. No. 09824413.0-1551, dated Feb. 11, 2013.
Notice of Reasons for Rejection from Japanese Patent Appl. No. 2011-534993, dated Mar. 12, 2013.
Notification of the Second Office Action from Chinese Patent Application No. 201010167346.2, dated Feb. 17, 2013.
Notice of Reasons for Rejection from Japanese Patent Application No. 2007-211901, dated Apr. 9. 2013.
Decision of Rejection from Japanese Patent Application No. 2011-545616, dated Apr. 26, 2013.

\* cited by examiner

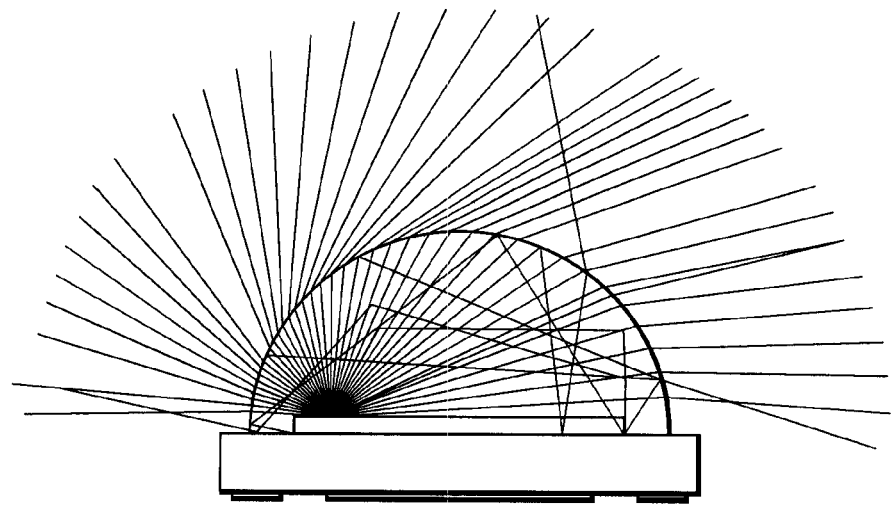
FIG. 2a
PRIOR ART
FIG. 2b
PRIOR ART
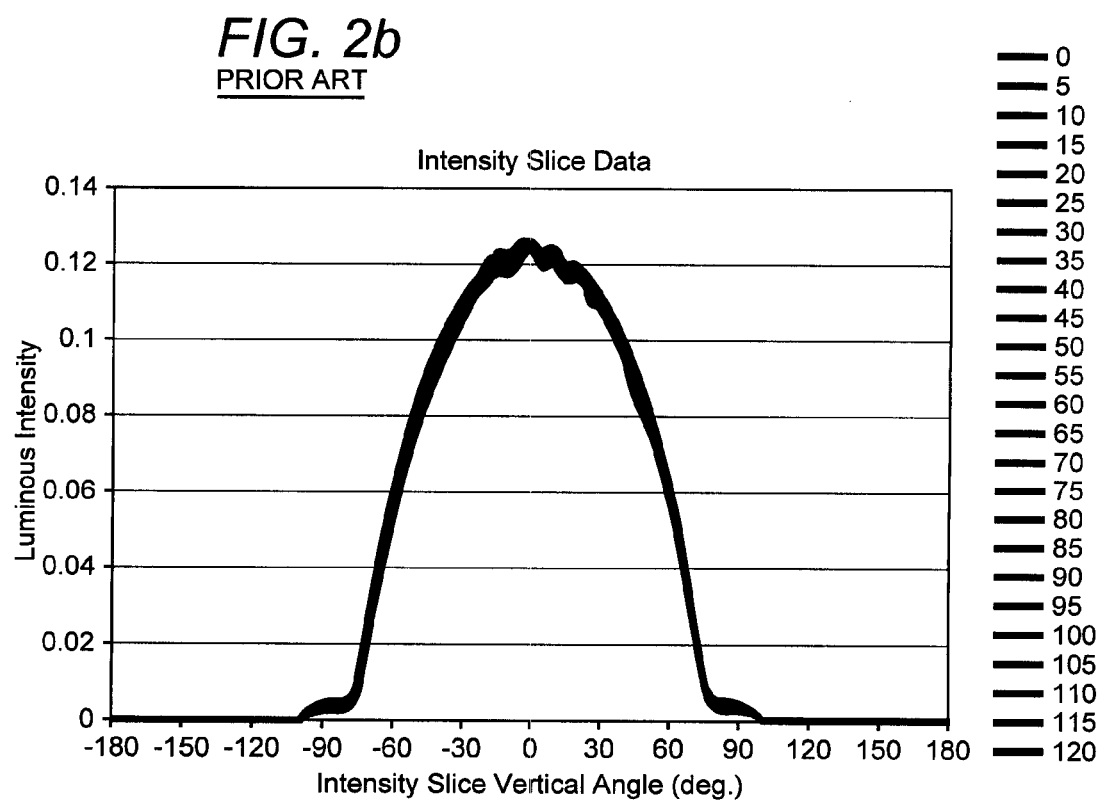

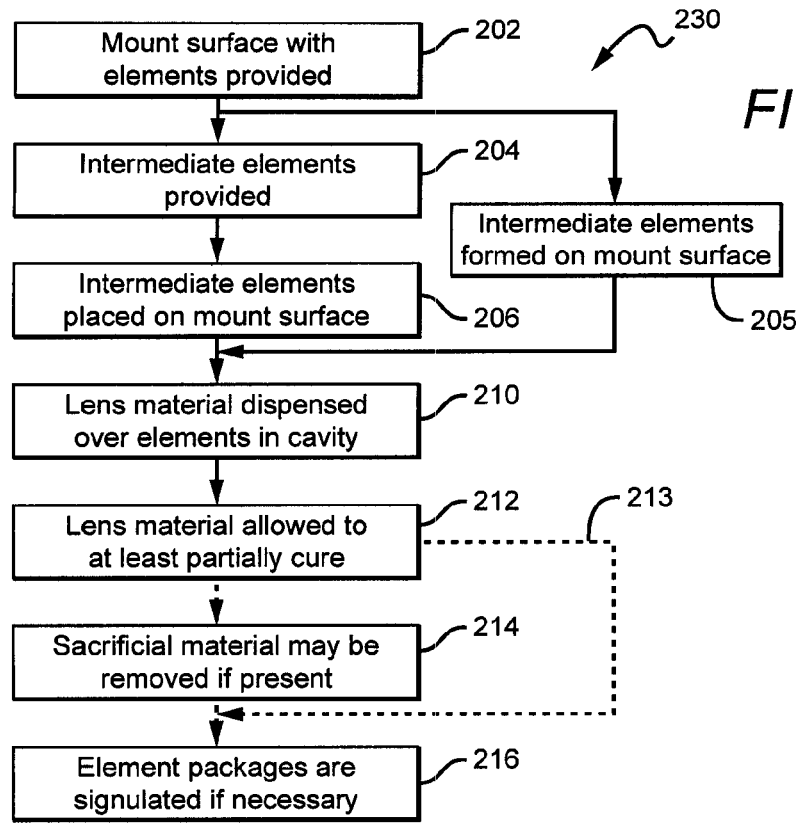
FIG. 21
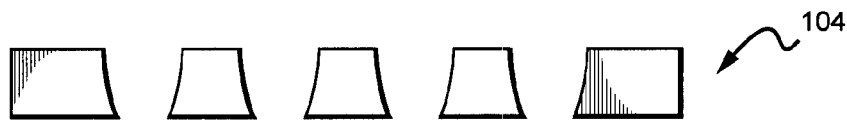
FIG. 22
FIG. 23
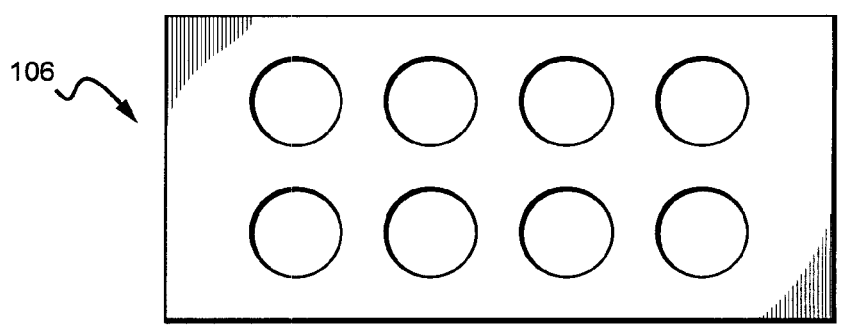

COMPLEX PRIMARY OPTICS WITH INTERMEDIATE ELEMENTS

BACKGROUND OF THE INVENTION

1. Field of the Invention

The present invention relates to fabricating light emitter packages and optical elements and, more specifically, to primary optics and packages for LED devices and methods of manufacturing such optics and packages.

2. Description of the Related Art

Light emitting diodes (LEDs) are solid state devices that convert electric energy to light, and generally comprise one or more active layers of semiconductor material sandwiched between oppositely doped layers. When a bias is applied across the doped layers, holes and electrons are injected into the active layer where they recombine to generate light. Light is emitted from the active layer and from all surfaces of the LED. The useful light is generally emitted in a hemispherical emission pattern in the direction of the LED's top surface, typically resulting in a predominantly Lambertian light emission profile. This confined emission is not generally suitable for many applications such as those requiring specific beam shaping; for example, collimated beam profiles, dispersed beam profiles, or specialized beam profiles.

In order to facilitate the use of LEDs in various applications, LEDs are typically arranged in a package which encases and protects the LED and provides electrical and thermal contact as well as enhances the emission of light from the LED.

LED packages typically incorporate some type of encapsulant such as a transparent epoxy or silicone material surrounding the LED chip to enhance light extraction from the chip and protect the chip and related contacts structure (e.g. wire bonds) from exposure to physical damage or environmental conditions which could lead to corrosion or degradation.

LED packages may also incorporate a 'primary' optical element to enhance light extraction from the package and in some instances to provide output light beam shaping by controlling the angle-dependent emission properties of the lamp. The primary optical element typically has a predominantly hemispherical profile and may be formed by shaping the encapsulant (e.g., by a molding process), or may comprise a separately fabricated optical element (e.g., a molded glass or silicone lens) that may be mounted to the package—typically in contact with the encapsulant material.

LEDs intended for lower-power applications such as signal or indicator lights are often arranged in packages that can include a molded or cast plastic body that encapsulates an LED chip, a lens, and conductive traces or leads. Heat is typically generated by LEDs when power is applied and the LEDs are emitting light. The traces or leads serve as a conduit to supply the LED chip with electrical power and can also serve to draw heat away from the LED chip. In some packages, a portion of the lead frame extends out of the package for connection to circuits external to the lead frame package.

For current state-of-the-art LED packages intended for lighting applications, a common configuration is the "surface mount" package which incorporates one or more LED chips mounted onto a planar substrate. Such packages typically include an appropriate encapsulant material (e.g., silicone) as well as a primary optic element. In some cases, the primary optic element may be produced by forming the encapsulant material into a specified shape as it is added to the package—for example by molding the silicone encapsulant into a hemispherical shape using a process such as injection molding. Alternately, a separate glass or molded silicone lens may be applied to the package. For surface mount packages, which typically require high temperature (200-300° C.) solder reflow processing to attach the LED package to its final fixture, the possible lens and encapsulant materials typically include silicones and glasses.

In surface mount packages where a separate lens is applied, the lens typically comprises a solid hemisphere with a substantially flat or planar surface which is mounted above the LED chip to allow clearance for the LED chip wire bonds. This requires that the LED chip be placed below the origin of the hemisphere and may necessitate a supportive element which holds the lens at a specified height above the chips and "retains" the lens by preventing lateral deflection relative to the LEDs. For a supportive element's retention features to retain the lens against lateral forces, it may be necessary for a retaining feature to rise above the bottom surface and surround the lower portion of the lens. In the package described in U.S. Patent Application Publication No. 2004/0079957 to Loh, the hemispherical lens sits within a recessed lip of the reflector plate. For various cost and fabrication reasons, this retaining feature is typically not transparent to light but rather is reflective. This arrangement can result in some of the light emitted by the LED chip being lost due to loss mechanisms such as total internal reflection. Further, because the LED chip sits below the bottom surface of the hemispheric lens, additional reflective surfaces are required to direct sideways emitted LED light to the lens and out the package. This reflection process is not 100% efficient, resulting in additional loss of light. Also, reflections from these surfaces effectively create a larger, more complex light source (compared, for example, to the chip alone) which can require more complex secondary optics that can result in additional light loss.

By nature, the primary optical elements and associated encapsulant materials of surface mount LED packages typically surround or encapsulate one or more LED chips and any associated electrical contacts. The preferred geometry for the primary optical element 10 has been a predominantly hemispherical shape, as shown in FIGS. 1a-1e. This shape has two primary benefits: (1) if large enough relative to the LED source, most of the light emitted by the LED is incident on the optic surface with a path that is nearly parallel to the surface normal (since the optic is typically surrounded by air and has an index of refraction higher than air, this minimizes the possibility of total internal reflection and hence efficiency loss), and (2) hemispherical shapes are readily fabricated onto planar surfaces by conventional molding processes. If the diameter of the hemispherical optic is not large compared to the largest dimension of the associated LED source, the package may suffer from output losses caused by total internal reflection ("TIR") within the optic, resulting in a low package extraction efficiency.

While the hemispherical optic 10 geometry is desirable with respect to efficiency and ease of fabrication, this geometry typically does little to modify the initial optical output beam profile from the LED source. As a result, the light output from the package may be predominantly Lambertian in nature, as shown in FIGS. 2A and 2B—similar to that emitted by a typical LED. In order to achieve a substantially non-Lambertian light beam profile (e.g., collimated, dispersed, or otherwise shaped) from a primary optic centered over a predominantly Lambertian emitting source such as a typical LED or array of LEDs, it is generally necessary to utilize a more complex optical geometry. However, many such geometries are not readily fabricated by molding processes. Specifically, since the mold cavity must be removed from the substrate surface following curing of the molded optic, it is not generally possible to mold parts which have 'overhangs', are tapered, or are narrower at the base (near the substrate) than at the top.

As illustrated in FIGS. 1c-e, in traditional molding, a mold 108 is applied to a planar substrate 100 with associated LED chips 102. The cavities in the mold are filled with a suitable encapsulating/optical material such as silicone or epoxy. The encapsulant is then at least partially cured, and the mold removed, leaving behind encapsulant on the surface in the form of a primary optical element. In order to remove the mold from the primary optic after at least partial curing, it is necessary that there are no regions of 'overhang' which would prohibit mold removal. This limitation in particular can inhibit the molding of many collimating-type optics. While there are molding techniques which can allow such geometries, they typically involve complex molds with moving parts which are not suitable for batch fabrication of many molded elements in an array on one surface. Undercuts on optics require mold pieces to pull out or separate in a lateral direction (e.g., parallel to the substrate surface). These mold types, called side-action molds, are thus not well suited to the fabrication of dense arrays of optics on a substrate as the lateral motions of adjacent lenses would interfere. While individual (rather than batch) molding of complex optics using side-action molds may be possible, molding LED package optics one-at-a-time is generally not feasible due to the associated high manufacturing cost and low throughput.

Alternative approaches to the fabrication of primary optics on LED packages are also generally not suitable for the batch formation of complex optic shapes. For example, predominantly hemispherical shapes may be achieved by a dispensing process. However, the shape of such optics is determined primarily by dispensed mass, surface tension, and gravity, with little flexibility for forming specific non-hemispherical shapes such as those with an "undercut" feature. Similarly, approaches utilizing a primary optic element which is molded separately and then attached to the LED package can be limited by the need to place the optic above the surface of the LEDs and associated electrical contacts and also provide stable attachment to the package. Such an approach would suffer from cost, efficiency, and manufacturability issues compared to the more simple molding process.

As a result of these limitations, beam shaping for LED packages is typically achieved through the use of "secondary" optics. Such secondary optics generally increase overall cost and reduce efficiency. Further, the shape of the secondary optic can be limited by the size and geometry of the primary LED optic or lens—this can further reduce efficiency and limit the potential for beam shaping in some applications, particularly those involving collimation of the LED light, where it is helpful to bring the optical element as close to the light source (LED chip or chips) as possible. The use of secondary optics can result in lighting solutions which are bulky, require additional design work and alignment, optical loss, and additional costs. In addition, the materials commonly used in the fabrication of secondary optics (e.g., plastics, polycarbonate, PMMA or glass) can result in elements which are costly, heavy, and less stable with respect to degradation when subjected to the heat and high intensity light associated with lighting-class LED packages.

Additionally, depending on the application, there may be cases where a secondary optical element is required (e.g., if the required light beam profile necessitates an optical element which is too large to conveniently or economically fabricate as a primary optical element on a LED package). In such cases, the ability to fabricate a more complex primary optic may still find application in that the geometry of the primary optic may be tailored to produce an optical beam profile which reduces the constraints on the design of the secondary optical element, thereby enabling, for example, a lower cost or less bulky, more simplified secondary optic and reducing overall system costs.

SUMMARY OF THE INVENTION

The present invention provides various embodiments of optics and methods of fabricating the same such that these optics are capable of beam shaping and can be manufactured in batches or arrays. Furthermore, these optics may include overhangs or tapered shapes without the need for complex molds with moving parts.

One embodiment according to the present invention of a method for fabricating a light emitter package comprises providing a surface with a light emitter. Next, at least one intermediate element at least partially surrounding the light emitter and creating a cavity is provided. Following this step an encapsulant material is provided over the light emitter in the cavity, covering at least part of the light emitter such that the shape of the encapsulant is at least partially defined by the intermediate element. Lastly, the encapsulant is at least partially cured to form a primary optic.

Another embodiment according to the present invention relates to a light emitter package comprising a light emitter disposed on a surface. The package further comprises at least one intermediate element on the surface which at least partially surrounds the light emitter. Lastly, the package includes an encapsulant over the light emitter forming a primary optic, where the intermediate element at least partially defines the shape of the primary optic.

Other embodiments according to the present invention also include arrays of packages and fabrication of arrays of these packages.

A better understanding of the features and advantages of the present embodiments will be obtained by reference to the following detailed description of the invention and accompanying drawings which set forth illustrative embodiments in which the principles of the invention are utilized.

BRIEF DESCRIPTION OF THE DRAWINGS

FIG. 2a is a side view of an embodiment of a traditional LED package with a hemispherical primary optical element or lens with simulated light rays.

FIG. 2b is a chart demonstrating the intensity slice data of light output of a traditional LED package with a hemispherical primary optical element or lens with simulated light rays.

FIG. 21 is a flow chart depicting another embodiment of an optic fabrication process according to the present invention.

FIG. 22 is a side view of one embodiment of intermediate elements according to the present invention.

FIG. 23 is a top view of one embodiment of an intermediate element panel according to the present invention.

DETAILED DESCRIPTION OF THE INVENTION

Figure 1A:
FIG. 1a is a side view of an embodiment of a traditional LED package with a hemispherical primary optical element or lens.
Figure 1B:
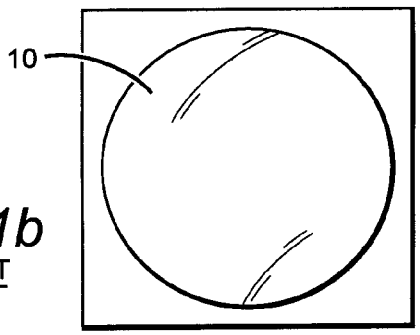
FIG. 1b is a top view of an embodiment of a traditional LED package with a hemispherical primary optical element or lens.
Figure 1C:
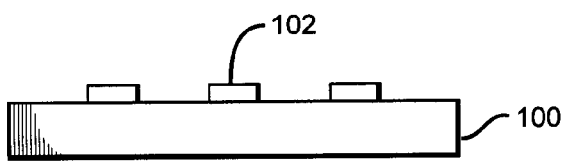
FIG. 1c is a side view of the first step in an embodiment of fabricating a traditional LED package with a hemispherical primary optical element or lens.
Figure 1D:
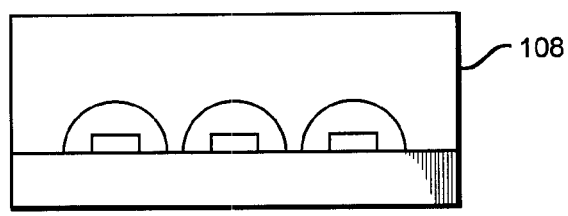
FIG. 1d is a side view of the second step in an embodiment of fabricating a traditional LED package with a hemispherical primary optical element or lens.
Figure 1E:
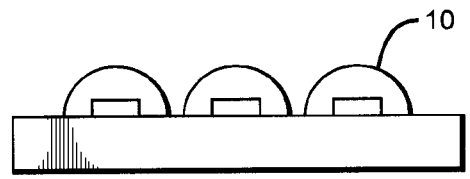
FIG. 1e is a side view of the third step in an embodiment of fabricating a traditional LED package with a hemispherical primary optical element or lens.

Embodiments of the present invention provide improved light emitting device optics and packages and methods for fabricating the same, wherein the improvements are provided by fabricating more complex primary optics capable of shaping light beams over light emitters. The primary optics disclosed herein, and methods of fabricating the same, allow for more controlled or shaped light outputs from light emitters without the use of secondary optics. However, secondary optics may still be used in conjunction with these primary optics. Furthermore, the methods disclosed herein allow for the fabrication of arrays of optics according to the present invention in smaller areas because no moving parts or side action molds are required. Embodiments of the present invention may be used in combination with previously disclosed light extraction and optic approaches, allowing even greater flexibility in controlling the light emission pattern from LED devices. The invention may be applied to other light sources such as lasers, optical fibers, etc. or even to non-light emitting applications (e.g., camera phone lenses, etc.) where it is desirable to fabricate a complex optical element onto a surface.

The present invention is described below with reference to forming complex primary optics capable of shaping light beams over light emitters. It is understood, that the present invention can be used in forming lenses in many other applications. For example, the present invention can used to form optics that collect rather than shape light from light emitters. This can be used in many different applications such as a concentrating lens on a miniature solar cell, or for a cellphone camera lens. Accordingly, the present invention should not be limited to primary optics over light emitters.

It is understood that when an element such as a layer, region or substrate is referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Although the terms first, second, etc. may be used herein to describe various elements, components, regions, layers and/or sections, these elements, components, regions, layers and/or sections should not be limited by these terms. These terms are only used to distinguish one element, component, region, layer or section from another. Thus, a first element, component, region, layer or section discussed below could be termed a second element, component, region, layer or section without departing from the teachings of the present invention.

It is noted that the terms "layer" and "layers" are used interchangeably throughout the application. A person of ordinary skill in the art will understand that a single "layer" of material may actually comprise several individual layers of material. Likewise, several "layers" of material may be considered functionally as a single layer. In other words the term "layer" does not denote a homogenous layer of material. A single "layer" may contain various material concentrations and compositions that are localized in sub-layers. These sub-layers may be formed in a single formation step or in multiple steps. Unless specifically stated otherwise, it is not intended to limit the scope of the invention as embodied in the claims by describing an element as comprising a "layer" or "layers" of material.

Embodiments of the invention are described herein with reference to cross-sectional view illustrations that are schematic illustrations of idealized embodiments of the invention. As such, variations from the shapes of the illustrations as a result, for example, of manufacturing techniques and/or tolerances are expected. Embodiments of the invention should not be construed as limited to the particular shapes of the regions or particles illustrated herein but are to include deviations in shapes that result, for example, from manufacturing. A region illustrated or described as rectangular, for example, will typically have rounded or curved features due to normal manufacturing techniques. Thus, the regions illustrated in the figures are schematic in nature; their shapes are not intended to illustrate the precise shape of a region or particle and are not intended to limit the scope of the invention.

The term "light" as used herein is not limited to electromagnetic radiation within the visible spectrum. For convenience, "light" may also include portions of the electromagnetic spectrum outside the visible spectrum, such as the infrared or ultraviolet spectra, for example.

In some embodiments, it can be desirable to shape optics such that reflection or total internal reflection ("TIR") causes light beams incident on the sidewalls to reflect towards the exit face and be incident on the exit face with an angle less than or equal to the critical angle. Consequently, light loss due to TIR at the exit face is reduced or eliminated. An exit face of an optic is face or surface from which light beams should be exiting. Also, it can be desirable to use an optic which is as small as possible and the use of only a primary optic is smaller than the use of a primary and secondary optic due to the Etendue equation, because the size of a single optic would not need to accommodate the added distance from the light emitter caused by the use of both a primary and secondary optic. While the Etendue equation shows that theoretically 100% of the light that passes from the LED into the primary optic of the LED can exit the optic through the exit face, various embodiments may cause lesser amounts of light to exit the exit face while still providing significant improvements over prior LED light emissions. For example, light emitted from the exit surface of the LED may be emitted from the exit surface with an efficiency loss due to Fresnel losses.

Fresnel losses (e.g. losses at the interface between two mediums such as at the exit face of an LED and air or other medium) occur when light traverses from a medium of higher index to a medium of lower index. Depending on the index of refraction difference, on index difference, losses of approximately 4% of light output due to reflection may occur. Fresnel losses may be reduced or overcome by the reduction of interfaces, such as by only using a primary optic rather than both a primary optic and a secondary optic.

Typically, LEDs and LED packages emit light in a predominantly Lambertian beam patter (FIG. 2B). For many applications, it may be desirable to either broaden (disperse) or narrow (collimate) the output light beam from the LED package. Collimation of the light output beam profile from LED packages is particularly useful for applications such as flashlights, spot lights, directional lighting (track lighting, recessed ceiling lighting), projectors etc. where a more concentrated beam of light is required. One example of a collimating optic geometry useful in reducing the beam profile width of a light emitter is the parabolic concentrator.

In designing collimating optical elements for LEDs, the size of the exit face of the optic can be selected to conserve radiance. The passage of light along an optic path, either within a single medium or from one medium to another, is governed by the law of Conservation of Radiance, also referred to as the Brightness Theorem, which is expressed by the Etendue equation. The area of the exit face of an optic can be selected to conserve radiance of light entering the optic from the LED for a desired half angle. Consequently, light can be emitted in a desired half angle with high efficiency. The Etendue equation, or Conservation of Etendue, requires an exit face large enough to conserve radiance. Generally this exit face is larger than the base of the light emitter and therefore, to take advantage of an optic optimized according to the Etendue equation, a collimating primary optic for a LED package would have to have an exit face larger than the base of the optic as shown in FIGS. 3a-3f.

Figure 3A:
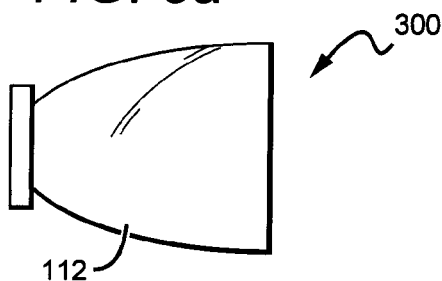
FIG. 3a is a rotated side view of an embodiment of a light emitter package with primary optic according to the present invention.
Figure 3B:
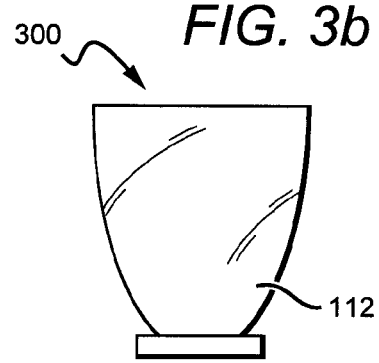
FIG. 3b is a side view of an embodiment of a light emitter package with primary optic according to the present invention.
Figure 3C:
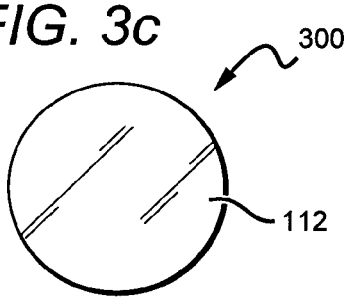
FIG. 3c is a top view of an embodiment of a light emitter package with primary optic according to the present invention.
Figure 3D:
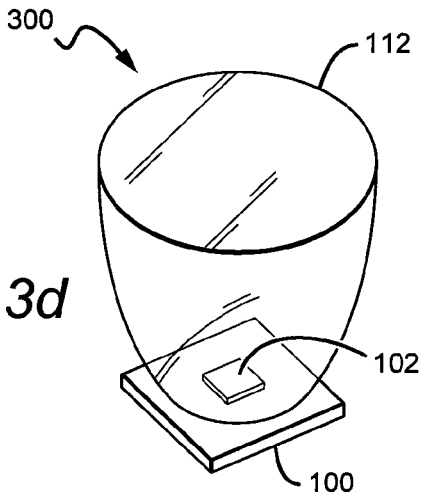
FIG. 3d is a perspective view of an embodiment of a light emitter package with primary optic according to the present invention.
Figure 3E:
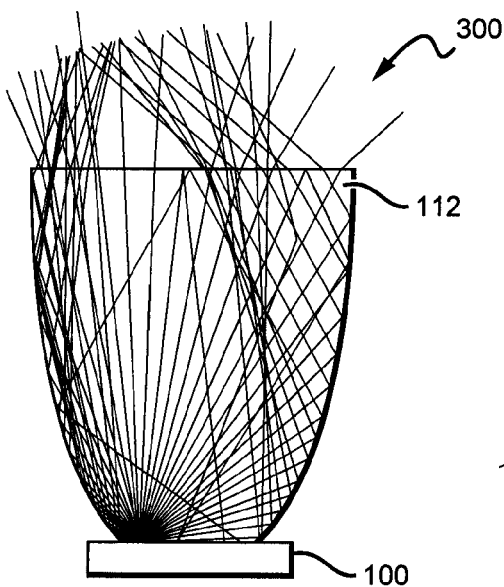
FIG. 3e is a side view of an embodiment of a light emitter package with primary optic with simulated light ray output according to the present invention.
Figure 3F:
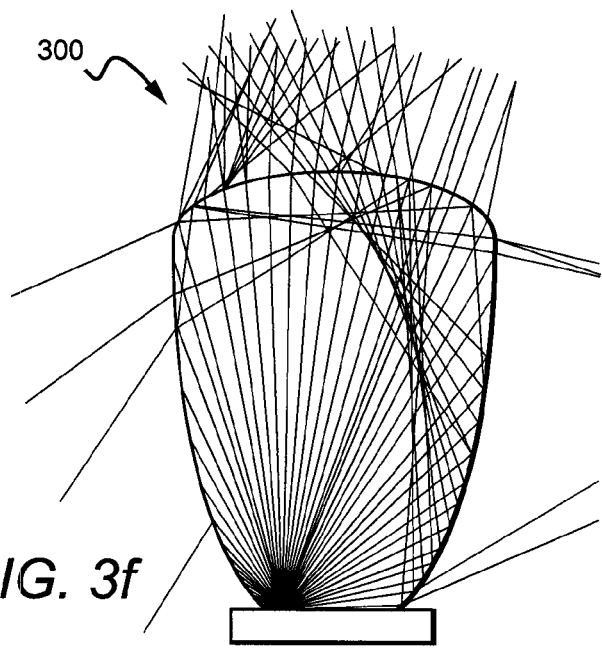
FIG. 3f is a side view of another embodiment of a light emitter package with primary optic with simulated light ray output according to the present invention.
Figure 3G:
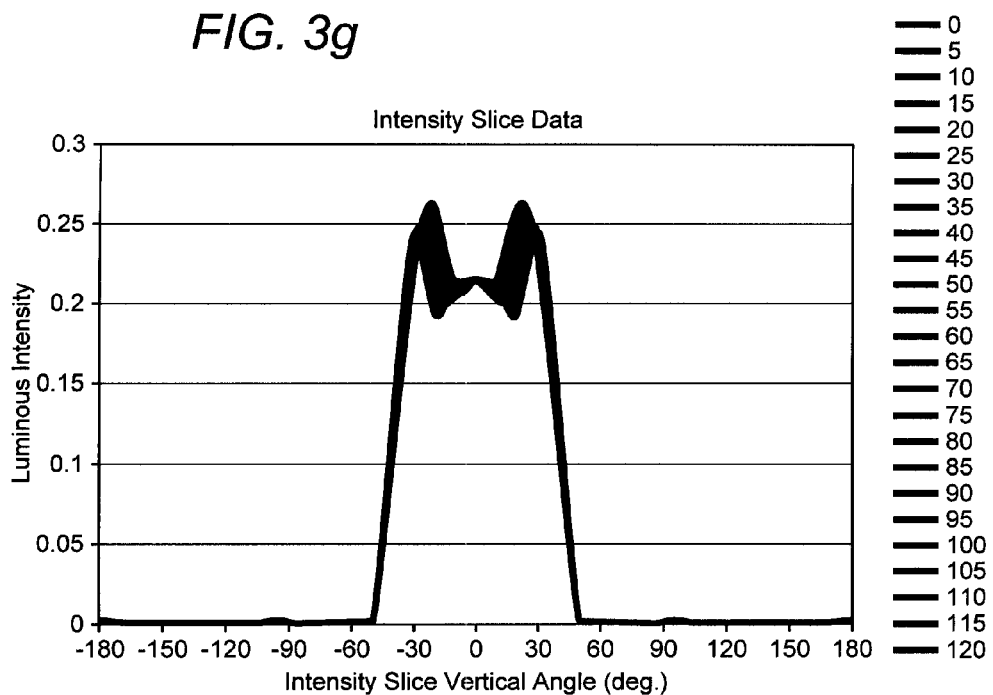
FIG. 3g is a chart demonstrating the intensity slice data of light output of the package of FIG. 3e with simulated light rays according to the present invention.

As shown in FIGS. 2A and 2B, conventional hemispherical LED optics have a broad light output. One advantage of the optics produced by the embodiments disclosed herein can be illustrated using optical ray tracing simulation of LED packages, as shown in FIGS. 2A and 3E, and 3F. In such simulations, it is often useful to consider light rays which are emitted from specific points on the surface of the light emitter (e.g., the LED). Of particular interest are typically light rays which are emitted from the farthest point on an emitter from the center or optical axis of the lens (e.g., for a square LED chip emitter centered within a lens, a corner point farthest from the center of the chip along a diagonal). For example, for the hemispherical lens LED package illustrated in FIG. 2A, light rays emitted from the center of the top surface of the LED chip (aligned with the center of the hemispherical lens) would impinge on the lens surface predominantly parallel to the lens surface normal. Such rays would therefore pass through the lens (having index of refraction of typically ~1.5) to air (index of refraction of ~1) with essentially only minimal loss or reflection due to Fresnel loss—on the order of 4%.

As illustrated in FIG. 2A, light rays emitted from a point on the emitter surface farthest from the center can impinge on the lens/air interface with an angle substantially different from ninety degrees (e.g., with ninety degrees being parallel to the surface normal of the lens at the lens/air interface). The passage of light from a medium of one index of refraction ("RI") to a medium of a different RI is governed by Snell's Law. Snell's law defines the relationship between the angle of approach of a light ray as measured from the normal to the interface surface, and the angle of departure of that ray from the interface, as a function of the indices of refraction of both media. In the case of the passage of light from a medium of higher RI to a medium of lower RI, the maximum angle at which a light ray may strike the interface surface between the media and still pass through the interface is called the critical angle. Fundamentally, light originating from the medium of higher RI must approach the media interface at angles not exceeding the critical angle if the light is to pass through the interface and into the medium of lower RI. Rays that approach at angles greater than the critical angle will be reflected back within the medium of higher RI at the interface between the media and will not pass into the medium of lower RI. This is referred to as total internal reflection ("TIR"). In general, it is desirable to reduce the number of interfaces causing TIR in the directions in which light is intended to be emitted.

FIGS. 3E and 3F also show ray tracing simulations for rays originating at a point farthest from the center of the emitter— as FIG. 2B shows the simulated broad light beam intensity profile typically achieved using conventional hemispherical molded optical elements (lenses) according to the ray tracing simulation described above.

In order to create an LED package capable of shaping a beam, the primary optic must include features which can be used to shape a beam. For example, to create a LED package with a primary optic capable of having a light output profile where the majority of the light emitted is within a specified critical angle, rather than a Lambertian output profile, the primary optic may require the incorporation of features described above, including tapering of the lens, undercuts, asymmetric features, beveling, bulges, reflective portions, hollow portions, or any other lens feature. Traditional fabrication of primary optics, on a substrate with the use of a mold, does not allow for the fabrication of optics which include a portion closer to the base that is narrower than the remainder of the optic, or an exit face larger than the base. Such a configuration would create an overhang and prevent the removal of a mold without damaging the optics. Complex molds with moving parts may be used to create such an optic but they require additional space between light emitters for the moving parts to function and therefore are not nearly as efficient, since fewer optics could be produced at a time. Stated differently, traditional molding processes may reduce production cost by fabricating many LED packages at a time, closely spaced together on a single substrate which then may be singulated to produce the individual packages, whereas the use of a more complex mold necessary for the fabrication of overhang or undercut features would require larger separation between LED packages, reducing the number of parts fabricated per run and increasing the substrate area per part. Correspondingly, in applications where an array of lenses is to be fabricated on a single substrate (without subsequent singulation into individual packages), the use of a complex mold would significantly limit the possible density of the array by increasing the minimum possible distance between lenses.

Using a primary optic to aid in beam shaping is advantageous to relying entirely on a secondary optic for this purpose. Secondary optics can be bulky, require the manufacturing, designing, and alignment of a second part, can cause optical loss, and add additional costs. Further, in order to minimize the cost associated with the secondary optic, relatively inexpensive plastic materials such as acrylic and polycarbonate are commonly used. While such materials are generally less expensive than typical primary LED package optics such as silicone and glass, plastic materials can generally have higher optical absorption (leading to efficiency loss) and may degrade or otherwise cause issues with respect to reliability when subject to the operating environment of the LED package over time.

Furthermore, utilizing a primary optic for beam shaping, can allow for a reduction in overall LED package/system size because the primary optic may be smaller in size and height relative to a comparable secondary optic while providing the same functionality due to the fact that the primary optic may generally be placed much closer to the light source than a secondary optic. For example, the primary optic need only cover the LED chip and associated electrical contacts while the secondary optic must be placed over the primary optic. This would allow for mounting of more LEDs (and associated packages and optics) closer together on a board.

For some applications, the degree of beam shaping required may necessitate an optical element which is larger than that which may be feasibly or economically produced as a primary optic on a LED package, thus requiring a secondary optic. For example, to achieve a highly collimated, narrow beam profile for a relatively large source size (LED or array of LEDs) with minimal efficiency loss, the principle of Etendue may require an optical geometry and size which greatly exceeds the desired footprint of the LED package. In such cases, the use of more complex, beam shaping primary optics as described in this invention may be used in conjunction with the secondary optic. For example, the primary optic may provide a pre-shaping, tilting, etc. of the optical beam so as to allow a more simplified, smaller, more cost efficient or more optically efficient secondary optic design.

Figure 18:
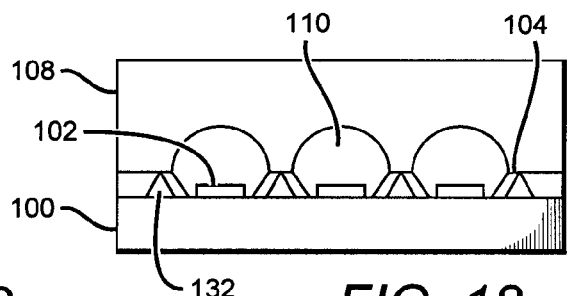
FIG. 18 is a side view of one embodiment of a mold over the structure of FIG. 17 according to the present invention.
Figure 19:
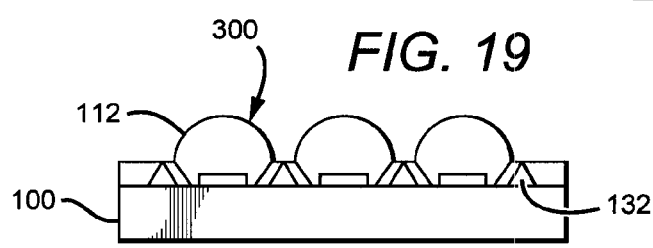
FIG. 19 is a side view of one embodiment of completed optics formed from the structure of FIG. 18 according to the present invention.
Figure 20:
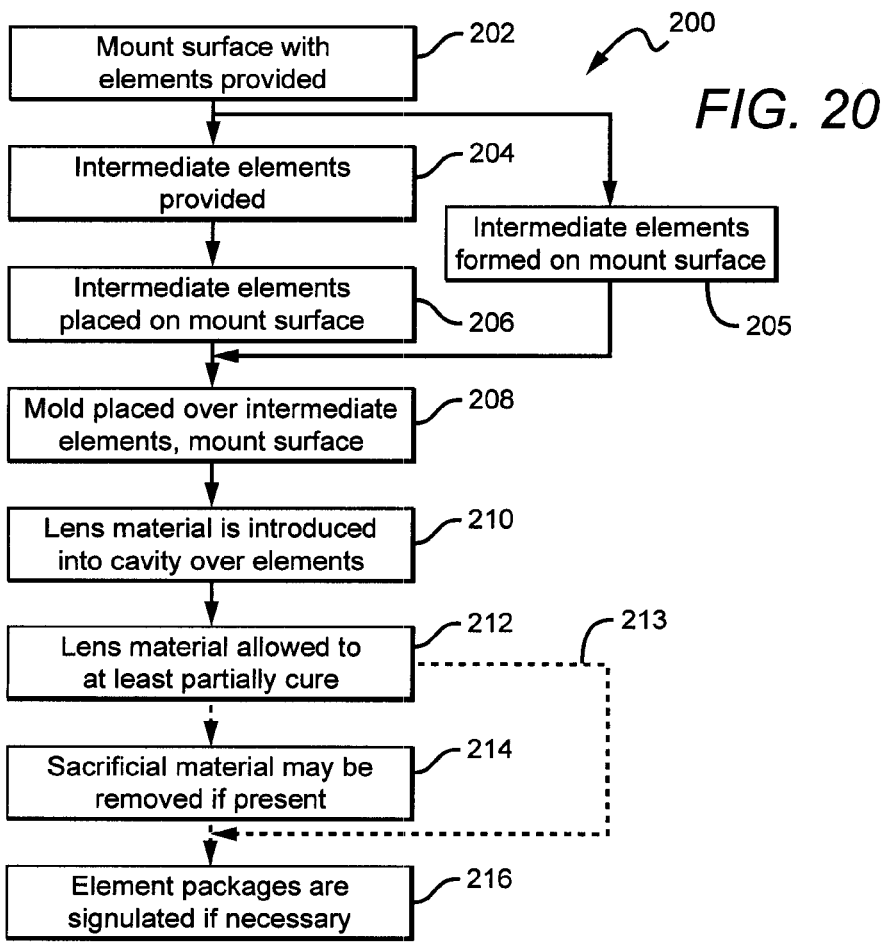
FIG. 20 is a flow chart depicting one embodiment of an optic fabrication process according to the present invention.

FIGS. 4-21 show devices and methods that are described in combination to show embodiments of fabricating an LED package or, more specifically, forming lenses over a number of elements on a mount surface where an intermediate element is utilized in forming the lenses. Forming of the lenses can be performed in cooperation with a mold (see FIGS. 12, 15, 18, 24) or without (see, for example, FIGS. 4-10). FIG. 20 shows a method 200 of forming optics over a number of elements using intermediate elements and a mold. FIGS. 11-19 show examples of devices being fabricated by the method 200 of FIG. 20. FIG. 21 shows a method 230 of forming optics over a number of elements using intermediate elements but not necessitating the use of a mold. FIGS. 4-10 show examples of devices being fabricated by the method 230 of FIG. 21. Although the methods 200 and 230 are described with reference to LEDs as the elements on the mount surface, it is understood that the method can be used to fabricate other devices. Elements may be other light sources such as lasers, optical fibers, etc. or the method may be used to fabricate non-light emitting devices where it is desirable to fabricate a complex optical element on a surface, such as camera phone lenses, etc. It is further understood that although the methods 200 and 230 are shown as a series of steps, the steps can occur in different order and different steps can be employed. Furthermore, though a variety of optic shapes are shown, optics may be formed in any shape including conventional lens shapes, tapered lenses, asymmetrical lenses, side-emitting lenses, lenses with undercuts, convex lenses, concave lenses, or any other lens shapes which create any type of output profile. In addition, though the methods 200, 230 refer to a plurality of elements provided on a mount surface or a plurality of LEDS, it is understood that this method could also be used to form optics for a single element or LED.

Some steps in the methods 200, 230 of FIGS. 20 and 21 may be similar, such as those relating to providing a mount surface with elements 202 and providing the intermediate elements. The methods 200, 230 are used are described in conjunction with certain device embodiments, but it is understood that the methods can be used to fabricate many different devices beyond those described herein.

Figure 14:
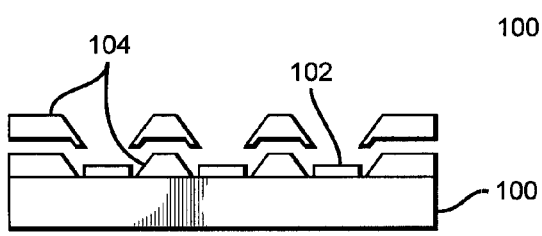
FIG. 14 is a side view of one embodiment of a surface with elements and intermediate material according to the present invention.
Figure 15:
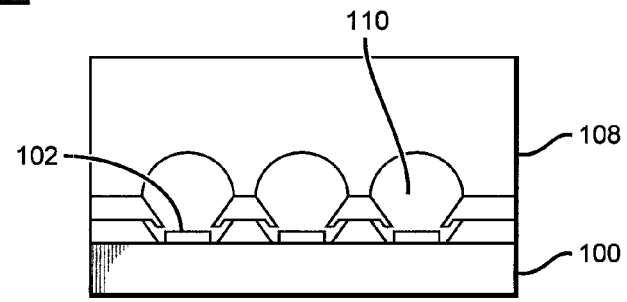
FIG. 15 is a side view of one embodiment of a mold over the structure of FIG. 14 according to the present invention.

In step 202, shown in both FIGS. 20 and 21, a mount surface 100 is provided with one or more LEDs 102, as shown for example in FIGS. 14-16. The mount surface or substrate 100 can be any mount surface and can be made of many different materials. Mount surfaces and substrates are known in the art and only briefly discussed herein. The mount surface or substrate may be a submount (e.g., ceramic or silicon with metal leads or traces), a metal heat sink, a printed circuit board, a metal-core printed circuit board, or any other structure. The substrate or mount surface 100 may comprise a semiconductor material or any other suitable material. In one embodiment, the mount surface 100 may be the original substrate on which the elements 102, such as LED chips, were grown. In another embodiment, the mount surface 100 may be a carrier substrate, rather than the original growth substrate, with one or more LEDs fabricated separately and then mounted to the carrier substrate. A carrier substrate might be used if, for example, the LED chips were fabricated using a flip-chip technique. It is also possible to mount the elements on many different kinds of surfaces.

Figure 6:
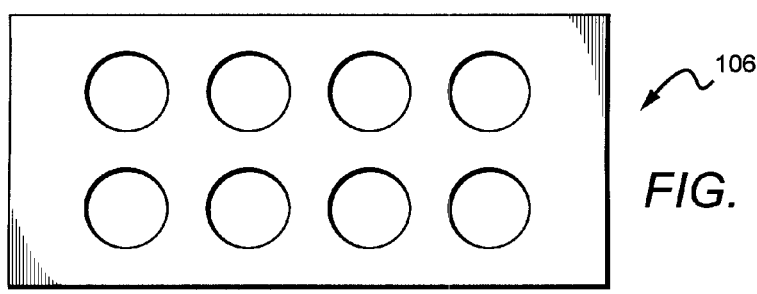
FIG. 6 is a top view of one embodiment of an intermediate element panel according to the present invention.
Figure 7:
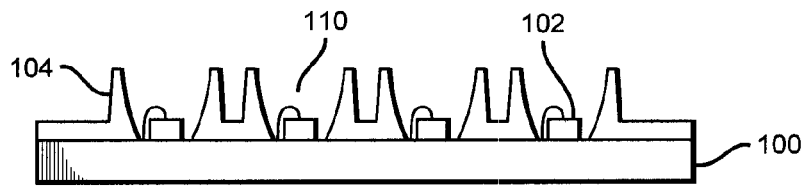
FIG. 7 is a side view of one embodiment of a surface with intermediate elements and light emitters according to the present invention.
Figure 11:
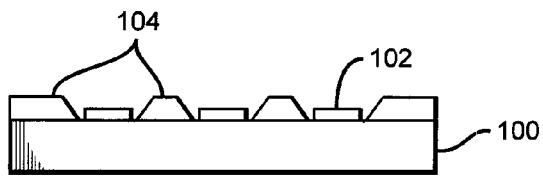
FIG. 11 is a side view of one embodiment of a surface with elements and intermediate material according to the present invention.

In steps 204 and 206 intermediate elements 104 are provided and placed on the mount surface 100. Intermediate elements may either be sacrificial or may remain as a part of the final molded element. Intermediate elements may be formed by any suitable method. In some embodiments, the method 200 and 230 include the alternative step of providing or forming the intermediate elements directly on the mount surface 100 (for example using any suitable means such as molding, injection molding, transfer molding, compression molding, dispensing, stencil printing, three-dimensional printing, photolithography, or deposition) or they may be formed separately and placed on or attached to the mount surface 100, as shown in FIGS. 7 and 11. In one embodiment the intermediate elements 104 may be formed as a panel 106, as shown in FIG. 6, by any suitable forming means such as molding, by injection molding, compression molding, and transfer molding, dispensing, stencil printing, three-dimensional printing, photolithography, or deposition. These techniques may also be used to form other portions of the components, such as the lens element. The panel 106 may then be aligned with the mount surface 100 and elements 102, and then attached to the mount surface 100. This panel may be fabricated by, for example, a molding process and may comprise a sheet of material with through-holes having an optically desirable profile. The intermediate elements 104 may be permanent, or they may be sacrificial such that they may be at least partially removed after the lens has been formed.

Intermediate elements 104 may be formed of any suitable materials. Examples of permanent or sacrificial layer materials in some embodiments can include thermoplastic polymers, polyvinyl alcohol (in some embodiments with filler materials such as starch, sodium chloride, fumed silica, etc.), wax, soluble plastics, photoresists and other photo-definable materials, or other materials which may be formed or removed (in the case of sacrificial intermediate layers) by water rinse (as in the case of polyvinyl alcohol), heat (in the case of wax), sublimation, vaporization, machining, developers and solvents (as in the case of photoresists), chemical etching/solvent, or plasma etching. Specific examples include water soluble PVOH compounds manufactured by MonoPol (Portage, Ind.) under the name "MonoPol" and extrudable vinyl alcohol copolymers manufactured by Nippon Gohsei of Japan under the trade name "Nichigo G-Polymer". In other embodiments, other soluble materials can also be used. Examples of materials for the intermediate elements may also include silicones, epoxies, moldable plastic materials, metals, etc. Any suitable material such as those which are transparent materials, reflective materials, or scattering materials (e.g. a white reflective plastic, or a transparent material containing scattering particles) may be used. Furthermore the intermediate element or layer could also contain phosphor or other wavelength converting substances, scattering particles, or bubbles.

In some embodiments, the sacrificial intermediate layer would comprise one or more layers of polyvinyl alcohol which has been specifically formulated to allow compatibility with injection molding and extrusion applications. Examples of non-sacrificial materials which can be used for the intermediate elements may include those materials described above in relation to all materials which may be used for intermediate layers or elements. In some embodiments both sacrificial and non-sacrificial materials can be used. In other embodiments multiple different sacrificial or non-sacrificial materials may be used. This would allow for the removal of different portions of the material at different times. Furthermore, the non-sacrificial portions may function both in the fabrication of the lens and as a portion of the optic or light extraction features.

Figure 12:
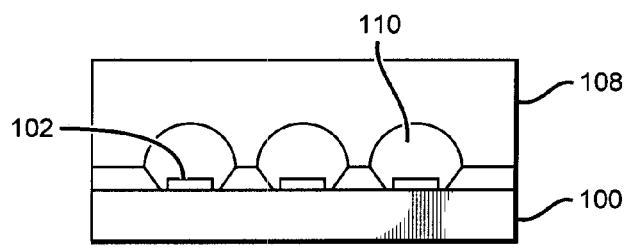
FIG. 12 is a side view of one embodiment of a mold over the structure of FIG. 11 according to the present invention.

Referring to FIGS. 11-20 in conjunction with the method of FIG. 20, in step 208 of FIG. 20 a mold 108 is placed over the mount surface, elements, and intermediate elements, such that the intermediate elements reside between the mold and the mount surface, as shown in FIG. 12. In some embodiments, the mold 108 cooperates with the intermediate elements 104 to create a cavity to be filled with encapsulant. Molds used to fabricate traditional optics can also be used in these embodiments. In other embodiments, as described below, a mold may not be required. The mold 108 can be made of any suitable material such as a metal. Molds and the use of molds are generally known in the art and only briefly described herein. Molds may be formed of any material selected from a metal material such as tool steel, an inorganic material such as ceramics or an organic material. The mold may also incorporate or utilize a mold release layer or film or a separate mold release layer or film may be used to facilitate separation of the mold surfaces from the encapsulant following the molding process.

Once the mold is in place, in step 210 a lens material is introduced over the elements 102 within the cavity 110 created by the mold 108, intermediate elements 104, and mount surface 100. The lens material may be any suitable encapsulating or optical material such as silicone or epoxy. The lens material may also include, or be coated with, phosphors or other wavelength converting materials, scattering materials, bubbles, or other light extraction, conversion, or modification features. In other embodiments, the lens material may be dispensed or otherwise introduced into the cavity formed by the mold prior to the placement of the mold over the elements.

Next, in step 212 the lens material is at least partially cured, and the mold 108 removed, leaving behind encapsulant on the surface in the form of a lens or primary optical element 112.

Figure 10:
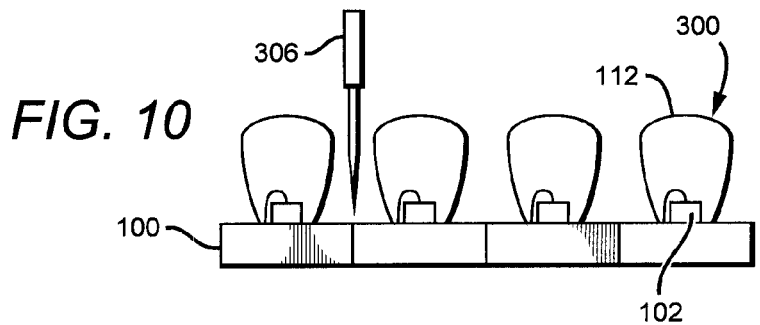
FIG. 10 is a side view of one embodiment of a package separation process according to the present invention.
Figure 13:
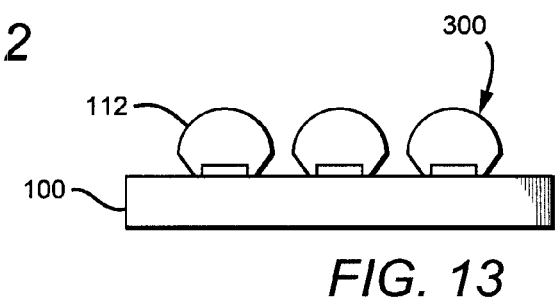
FIG. 13 is a side view of one embodiment of completed optics formed from the structure of FIG. 12 according to the present invention.
Figure 17:
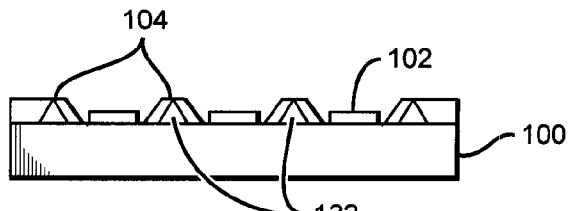
FIG. 17 is a side view of one embodiment of a surface with elements and intermediate material according to the present invention.

Following this step, if the intermediate elements 104 are sacrificial or removable, they may be removed in step 214. FIGS. 10 and 13 show examples of an embodiment where the intermediate elements have been removed. FIGS. 17-19, discussed in further detail below, show examples of an embodiment where the intermediate elements remain after the mold is removed. In the embodiments where the sacrificial material remains, step 214 can be bypassed as illustrated by phantom line 213. In step 216, the element packages can be singulated using known singulation methods.

As can be seen FIGS. 11-19, the resulting primary optical element can have a substantial 'overhang', or region of the element near the base which has a smaller diameter than regions above. This can be advantageous because it allows elements with such geometries to be fabricated using conventional molding processes instead of a complicated molding process, such as those using molds with moving parts. In many applications, such as collimating primary element design, this type of curvature near the substrate is very desirable, because it allows light emitted near the substrate to be reflected vertically, and this concave upward curvature is not feasible using conventional molding techniques. As can also be seen by the close proximity of elements 102 in the figures, more complex molding techniques such as the use of side-molds or more complex movable mold cavity elements is prohibited in cases where multiple optical elements are fabricated in close proximity on a single substrate, as is desired to minimize manufacturing costs or allow the fabrication of a dense array of close-packed optical elements on a single substrate or carrier.

In those embodiments where the intermediate material is removed in step 214, any suitable removal method may be used. Some examples of removal processes include removal by water rinse, heat, sublimation, vaporization, chemical etching/solvent, machining, laser, or other suitable methods. The removal process can be used to remove all of the sacrificial intermediate elements at once, or different methods can be used to remove different parts at different times, or only a portion can be removed. Additionally, the intermediate layer provided in step 204 and placed on the mount surface in step 205 may instead be formed directly on the mount surface, for example, using a molding process or dispense or other deposition process, or applied in the manner of a photoresist using a spin-on or other coating process. If necessary, application of the intermediate layer to the mount surface may be followed by an appropriate development, solvent, etching, machining or other forming step to create the desired cavities or other features in the intermediate layer.

Figure 16A:
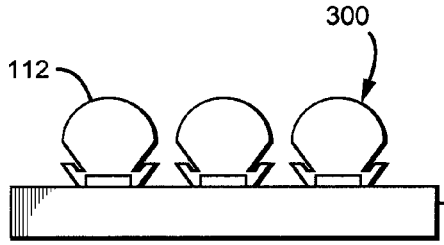
FIG. 16a is a side view of one embodiment of completed optics formed from the structure of FIG. 15 according to the present invention.
Figure 16B:
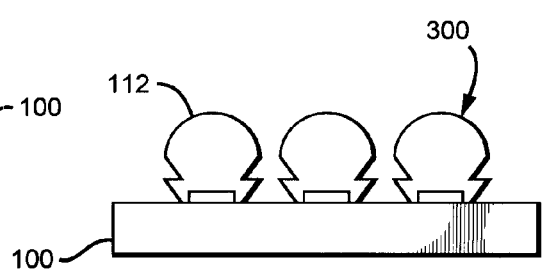
FIG. 16b is a side view of one embodiment of completed optics according to the present invention.
Figure 29:
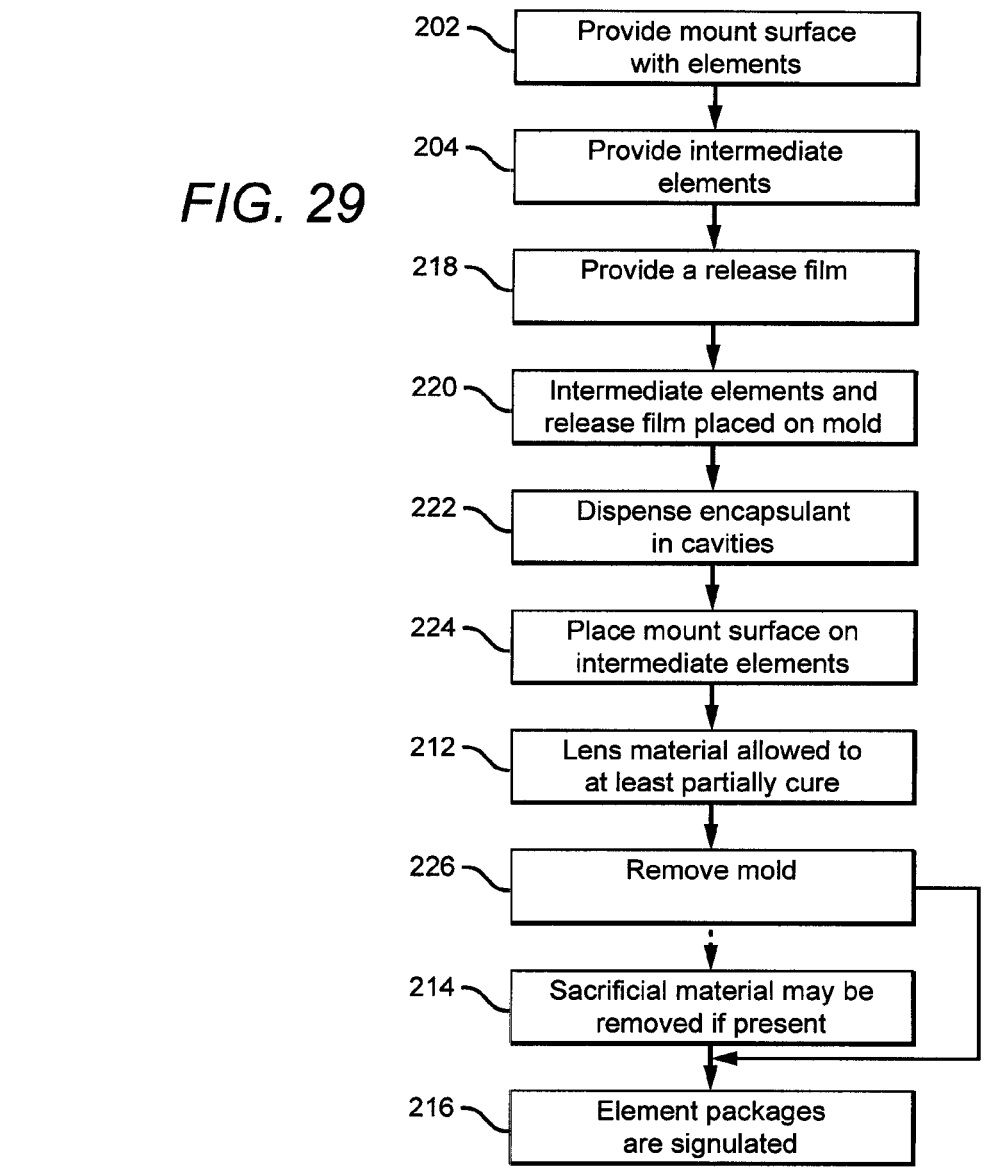
FIG. 29 is a flow chart depicting another embodiment of an optic fabrication process according to the present invention.

At the completion of the process in FIG. 20, whether step 214 was required or not, an LED package 300 is created with a primary optic or lens 112. These primary optics can be very complex due to the variety of shapes that can be created using the intermediate elements. As shown in FIGS. 14-16b, the lenses 112 may have multiple overhangs, as shown in FIG. 16b, or the creation of "internal" regions in the encapsulant, as seen in FIG. 16a, which can function as optical surfaces. It may be desirable to utilize more than one intermediate layer in a "stacked" layer fashion. In this case, multiple sacrificial intermediate layers could be fabricated (e.g., by injection molding or machining or forming of plates of material) and then stacked up prior to molding of the encapsulant compound. This approach would allow the fabrication of segmented optical elements (e.g., as in the case of Fresnel lenses) which can provide further flexibility in optical design. These overhangs can create complexities such as internal regions which may be air gaps or areas filled with other material. Furthermore, lenses which are not symmetrical, or asymmetrical (See FIG. 38), or tilted with respect to the mount surface may be formed, for example to create an optical beam pattern which is not symmetrical or aligned with the optic axis or surface normal to the mount surface. Similarly, each of the types of lenses that may be fabricated as described herein may be offset in the plane of the mount surface relative to the center of the emitter or emitter array to produce the desired optical effect such as beam tilt. It should be noted that the various layers and embodiments illustrated in these figures and subsequent figures may be combined in different arrangements than those shown explicitly. For example, any combination of sacrificial and permanent intermediate elements may be used, a sacrificial overlayer may be used without an intermediate element or layer, or combined with an integral intermediate layer, and a dispense approach may be used to fabricate the encapsulant layer rather than the molding approach shown in these figures. Further, the encapsulant material described herein may comprise one or more encapsulant layers or materials having differing properties (e.g., differing index of refraction) to achieve the desired results. The processes described in FIGS. 20, 21, and 29 and related processes may also be repeated sequentially, with or without changes to various process steps or materials. For example, a first sacrificial or permanent intermediate layer may be used to fabricate a first shaped encapsulant layer which is subsequently at least partially cured, and then a second sacrificial or permanent intermediate layer may be applied to produce a second shaped encapsulant layer which may at least partially cover or be adjacent to the first layer and may have different optical etc. properties, thereby allowing the fabrication of one or more primary optical elements having different properties or comprised of layers having different properties on the same mount surface.

As mentioned above, the intermediate layer and encapsulant may contain wavelength converting materials such as phosphors. The color or wavelength emitted by an LED is largely dependent on the properties of the material from which it is generated, such as the bandgap of the active region. LEDs have been built to emit light in a range of colors in the visible spectrum including red, yellow, green, and blue. Other LEDs emit in the ultraviolet (UV) range of the electromagnetic spectrum. It is often desirable to incorporate wavelength conversion materials such as phosphors into a LED package to tailor the emission spectrum by converting a portion of the light from the LED before it is emitted. For example, in some blue LEDs a portion of the blue light is "downconverted" to yellow light. Thus, the LED emits a combination of blue and yellow light to generate a spectrum that appears white to the human eye. As used herein, the term "phosphor" is used generically to indicate any photoluminescent material.

Phosphors have been disposed in various regions within the LED package. For example, phosphor may be dispersed inside, incorporated into, and/or coated outside an encapsulant that covers the LED device. In other embodiments the phosphor may be inside, incorporated into, or coated on the intermediate elements. The phosphor may be located remotely from the light emitting die as shown in U.S. Pat. No. 7,286,926. The phosphor may also be coated or deposited on the LED die or element itself. Several techniques are frequently used to introduce the phosphor, including electrophoretic deposition, stencil printing, spin or spray coating, etc. Another technique uses a phosphor dispense process where a drop of material, such as epoxy, silicone encapsulant, etc., that contains phosphor therein, may be placed on the die and cured to form a shell over the die. This is sometimes referred to as a "glob top" process. In another technique, the drop of material that contains phosphor may be placed on the die and allowed to settle. This technique may be referred to as "remote settling".

As used herein, the term "white light" is used in a general sense and includes light that different individuals or detectors may perceive as having a slight tint toward, for example, yellow or blue. Some conventional LED devices combine a yellow phosphor on a blue LED to achieve white light. Some of the blue light emitted from the LED passes through the phosphor without being converted, and some of the emitted blue light is downconverted to yellow. The combinations of blue light and yellow light that escape the light emitting device provide a white light output.

In one embodiment, the phosphor comprises many different compositions and phosphor materials alone or in combination. In one embodiment the single crystalline phosphor can comprise yttrium aluminum garnet (YAG, with chemical formula $Y_3Al_5O_{12}$). The YAG host can be combined with other compounds to achieve the desired emission wavelength. In one embodiment where the single crystalline phosphor absorbs blue light and re-emits yellow, the single crystalline phosphor can comprise YAG:Ce. This embodiment is particularly applicable to LEDs that emit a white light combination of blue and yellow light. A full range of broad yellow spectral emission is possible using conversion particles made of phosphors based on the $(Gd,Y)_3(Al,Ga)_5O_{12}$:Ce system, which include $Y_3Al_5O_{12}$:Ce (YAG). Other yellow phosphors that can be used for white emitting LED chips include:

$Tb_{3-x}RE_xO_{12}$:Ce (TAG);
RE=Y, Gd, La, Lu; or
$Sr_{2-x-y}Ra_xCa_ySiO_4$:Eu.

In other embodiments, other compounds can be used with a YAG host for absorption and re-emission of different wavelengths of light. For example, a YAG:Nb single crystal phosphor can be provided to absorb blue light and re-emit red light. First and second phosphors can also be combined for higher CRI white (i.e., warm white) with the yellow phosphors above combined with red phosphors. Various red phosphors can be used including:

$Sr_xCa_{1-x}$S:Eu, Y; Y-halide;
$CaSiAlN_3$:Eu; or
$Sr_{2-y}Ca_ySiO_4$:Eu.

Other phosphors can be used to create saturated color emission by converting substantially all light to a particular color. For example, the following phosphors can be used to generate green saturated light:

$SrGa_2S_4$:Eu;
$Sr_{2-y}Ba_ySiO_4$:Eu; or
$SrSi_2O_2N_2$:Eu.

The following lists some additional suitable phosphors that can be used as conversion particles, although others can be used. Each exhibits excitation in the blue and/or CV emission spectrum, provides a desirable peak emission, has efficient light conversion, and has acceptable Stokes shift:

Yellow/Green
$(Sr,Ca,Ba) (Al,Ga)_2S_4$:Eu$^{2+}$
$Ba_2(Mg,Zn)Si_2O_7$:Eu$^{2+}$
$Gd_{0.46}Sr_{0.31}Al_{1.23}O_xF_{1.38}$:Eu$^{2+}_{0.06}$
$(Ba_{1-x-y}Sr_xCa_y)SiO_4$:Eu
$Ba_2SiO_4$:Eu$^{2+}$ Red
$Lu_2O_3$:Eu$^{3+}$
$(Sr_{2-x}La_x)(Ce_{1-x}Eu_x)O_4$
$Sr_2Ce_{1-x}Eu_xO_4$
$Sr_{2-x}Eu_xCeO_4$
$SrTiO_3$:Pr$^{3+}$, Ga$^{3+}$
$CaAlSiN_3$:Eu$^{2+}$
$Sr_2Si_5N_8$:Eu$^{2+}$ The conversion materials can have different concentrations in the encapsulant depending on the conversion efficiency of the material. The conversion particles can be uniformly dispersed in the inner material, or the particles can settle around the LED so that the particles are closer to the LED. The encapsulant can also contain materials to help scatter the light, such as scattering particles.

Figure 37:
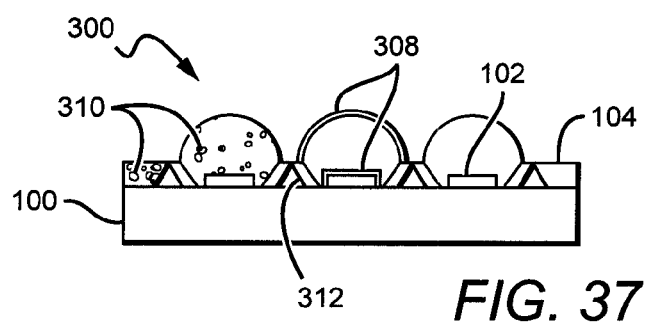
FIG. 37 is a side view of another embodiment of optics fabricated from a process according to the present invention.

As shown in FIG. 37, wavelength conversion material 308, 310 may be included in any place throughout the packages 300. In some embodiments, the wavelength conversion material 308 may coat the encapsulant, intermediate elements, and light emitters. In other embodiments, the wavelength conversion material may be included inside the intermediate elements or on a portion of the intermediate elements. In yet other embodiments, the wavelength conversion material particles 310 may be dispersed within the encapsulant or intermediate element.

In one embodiment, as shown in FIGS. 17-20, the intermediate element is not sacrificial, but instead remains as part of the overall optical element after the mold is removed. Again, this layer may be fabricated using conventional molding processes and comprise a sheet with an array of holes, placed separately element by element, or by any other suitable method such as those mentioned in this application.

As illustrated in FIG. 18, the intermediate elements 104 may also contain regions 132 which contain a different index of refraction relative to the intermediate layer (e.g., air pockets, other material), and/or the intermediate layer may have a similar or different index of refraction compared to the molded primary optical element. The introduction of air pockets or other material in these regions 132 in the intermediate element and the associated index of refraction boundary allows for the application of designs utilizing refraction or total internal refraction to accomplish similar beam profile control as achieved in other embodiments. In another embodiment, a similar effect could be obtained if the encapsulant process is designed such that the encapsulant intentionally delaminates from the surface of the integral intermediate layer, thereby resulting in a small gap (e.g., air gap) between the encapsulant material and the integral intermediate layer. The index of refraction difference at this gap would allow total internal reflection as well as refraction to occur at encapsulant/gap boundary. Such a gap could replace or augment any air pockets within the integral intermediate layer.

Similarly, the intermediate layer could contain reflective regions 312, as shown in FIG. 37. These reflective regions may be formed and comprised of any suitable method or material, for example, a silicone layer molded around a reflective cup or foil element, and then applied to the substrate prior to subsequent primary element molding, a reflective intermediate element itself, or reflective coating. In some embodiments, such reflective regions could comprise a leadframe type arrangement which is encased within the intermediate layer, or the lead-frame itself could comprise the integral intermediate layer or element.

Figure 4:
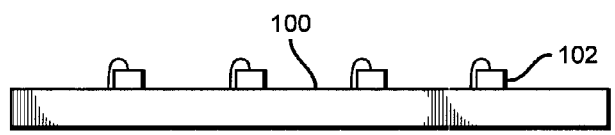
FIG. 4 is a side view of one embodiment of a surface with light emitters according to the present invention.
Figure 5:
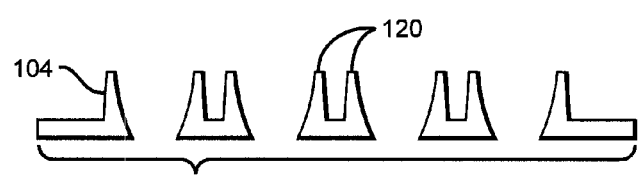
FIG. 5 is a side view of one embodiment of intermediate elements according to the present invention.

Referring back to FIGS. 4-10 and 21, FIG. 21 shows another embodiment of a method 230 of fabricating an LED package or, more specifically, forming lenses over a number of elements on a mount surface where an intermediate element is utilized in forming the lenses. In this embodiment an encapsulant dispense method is used in place of a mold. Examples of embodiments of this method 230 are shown in FIGS. 4-10. Dispense methods may be more desirable in some instances to mold processes because dispense methods may be more efficient and more cost effective. The same number designations are used for steps and elements which are the same as those in the other figures. Similarly to the method 200 shown in FIG. 20, this embodiment begins with step 202 by providing a substrate or mount surface 100 with elements or LEDs 102 on it, as shown in FIG. 4. This is followed by providing and placing the intermediate elements 104 in step 204, as shown in FIGS. 5 and 7. The intermediate elements can alternatively be molded in place in step 205, as described above.

Figure 8:
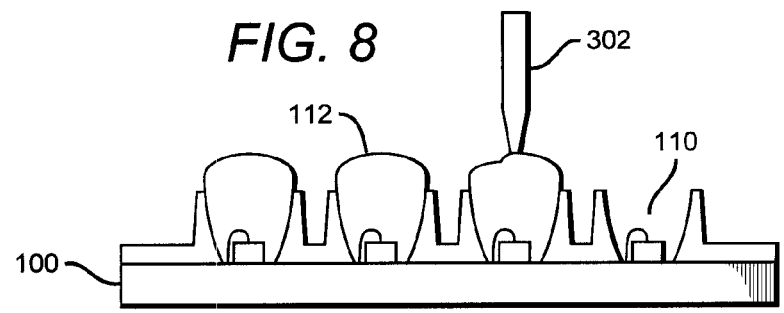
FIG. 8 is a side view of one embodiment of encapsulant material being dispensed over the structure of FIG. 7 according to the present invention.

The intermediate elements or layer may be formed as a panel 106 as shown in FIG. 6, separately, or by any other method. The intermediate elements 104 shown in FIG. 5 include meniscus forming features 120 to allow for the lens or encapsulant material to form a meniscus when it is dispensed in the cavity 110. In other embodiments the intermediate elements 104 may or may not include meniscus forming features. In other embodiments the intermediate elements 104 may comprise or be coated with materials which have a specific surface or interfacial properties with respect to the encapsulant in order to help control the flow of the encapsulant material during dispense. For example, intermediate elements having a high interfacial energy with respect to the encapsulant could be used to help prevent outflow of the encapsulant from the cavity formed by the intermediate layer, thereby facilitating the fabrication of encapsulant geometries which have a convex top surface shape as shown in FIG. 8.

Next, in step 210, the encapsulant or lens material 112 is dispensed over the elements 102 in cavity 110. The lens material 112 may be dispensed by any suitable method such as by the use of a dispensing tip 302. In some embodiments the lens material may be filled to a point within the cavity 110, in other embodiments it may be filled over the capacity of the cavity. In some of these embodiments, where there is meniscus forming feature, the lens material may be filled until the desired meniscus is formed. A meniscus feature holds the liquid encapsulant in a substantially hemispheric shape. This can be used to create a curved encapsulant face or can also allow for bubble free, reproducible, placement of another lens over the liquid encapsulant. The term "meniscus" refers to the convex surface of liquid which is formed by surface tension. The physical transitions can be features such as edges, corners, ledges, trenches, rings, and any other physical transition that creates a meniscus when a liquid surface comes in contact with it. The meniscus holding features are primarily described herein as rings, but it is understood that the meniscus holding features can have many different shapes such as square or oval with these shapes influencing the overall shape of the liquid held by the feature. As the liquid encapsulant is provided over the LED chip the meniscus between the encapsulant and meniscus ring holds a portion of the encapsulant in a hemispheric or convex shape over the LED chip.

Figure 9:
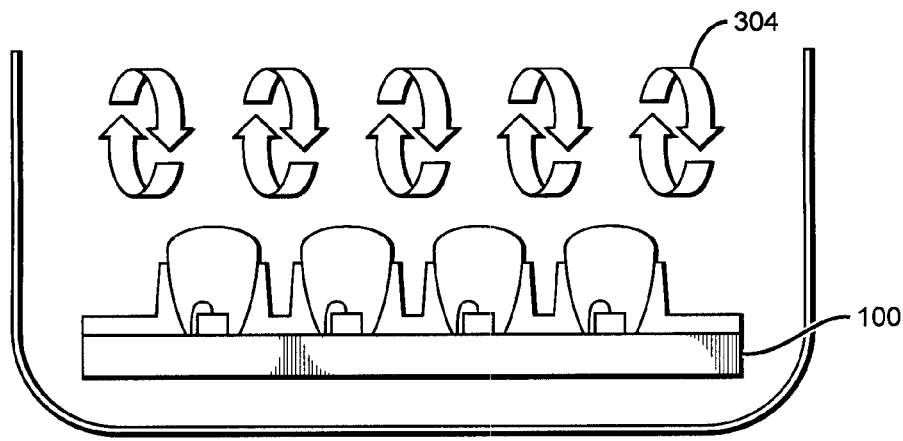
FIG. 9 is a side view of the structure of FIG. 8 placed in solvent in one embodiment of a removal process according to the present invention.

Following dispensing of the encapsulant or lens material, in step 212 the lens material is allowed to at least partially cure. After the lens material is allowed to at least partially cure, if any portion of the intermediate elements are to be removed, they are removed in step 214. Removal may be done by any of the processes described previously or any other suitable removal method. FIG. 9 shows the completed packages 300, including the substrate 100 with elements 102, intermediate elements 104, and at least partially cured lens material 112, immersed in a solvent 304 to remove the sacrificial portions. The solvent may be heated, re-circulated, stirred, or otherwise agitated to facilitate removal of the intermediate layer.

After the sacrificial portions, if any, are removed, the process may continue in step 216 where the packages 300 on substrate 100 can be singulated using any appropriate method including breaking or dicing by dicing blade 306 as shown in FIG. 10.

Figure 24:
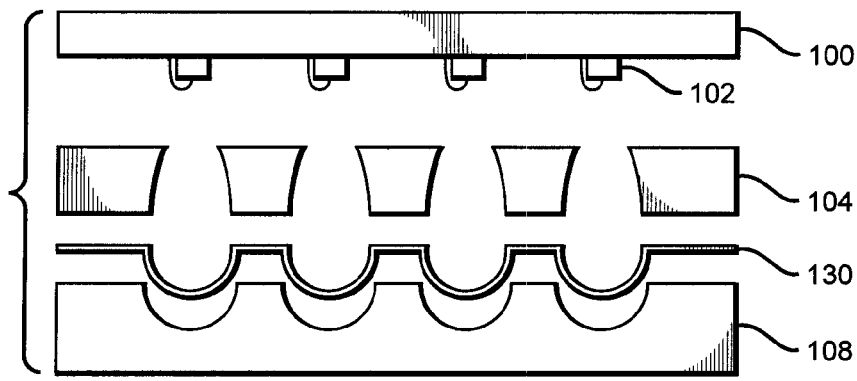
FIG. 24 is a side view of one embodiment of a molding process according to the present invention.
Figure 25:
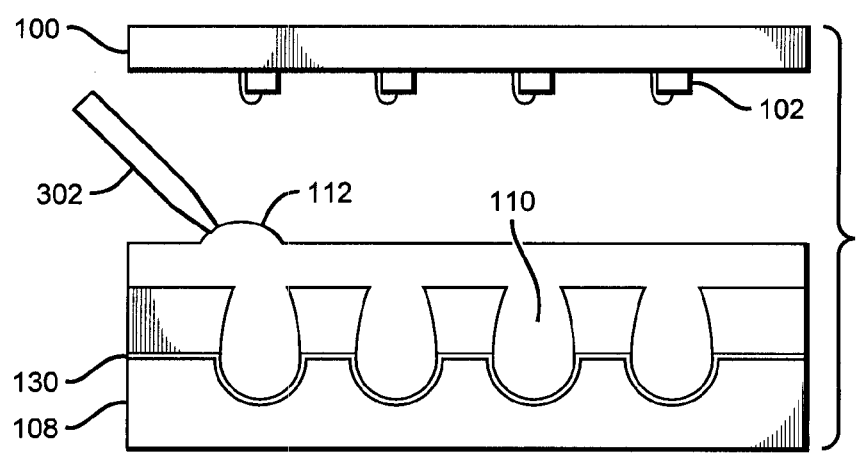
FIG. 25 is a side view of one embodiment of encapsulant material being dispensed over the structure of FIG. 24 according to the present invention.

FIGS. 22-29 are device and methods drawings that are described together to show another embodiment of fabricating an LED package or, more specifically, forming lenses over a number of elements on a mount surface where an intermediate element is utilized in forming the lenses. In this embodiment of a method 232 a mold is used in cooperation with a release film and intermediate elements to form optics. FIGS. 22-28 show examples of embodiments of method 232. Similarly to the previous embodiments, this embodiment begins with step 202 by providing a substrate or mount surface 100 with elements or LEDs 102 on it, as shown in FIG. 24. This is followed by providing intermediate elements 104 in step 204, as shown in FIGS. 22-24. The intermediate elements or layer may be formed as a panel 106 as shown in FIG. 23 or in any other suitable way such as separately or directly on the surface 100. In step 213 a release film is provided. In some embodiments, a very thin non-stick film, having the general shape of mold, is placed over the mold. Alternately, the release film may comprise a thin membrane which is placed over the mold and then made to conform to the mold surface, for example by applying vacuum to the region between the mold and film so as to conform the film to the mold. Release films can be used for improving releasing efficiency. The release film may also function to prevent the encapsulant material from adhering to the mold. Furthermore, a release film may be used to pattern encapsulant surfaces. A mold release film may be any material which exhibits good separation properties. Such materials may include polymer blends, water based mold release agents, silicon based mold release agents, or any other suitable release material. Release films are of a well known conventional material that prevents the sticking of silicone or other encapsulant material to metal. A release film is not needed if the lens material does not stick to the mold. This may be accomplished by using a non-stick mold coating, using a non-stick mold material, or using a mold process that results in a non-stick interface. Such processes may involve selecting certain process temperatures to obtain the minimum stick. By not using a release film, it is possible that more complex lenses may be formed.

In some embodiments the release film may be smooth. In other embodiments, the release film may include printed surface structures (e.g., microlens arrays) which may be transferred to the surface of the encapsulant of a LED package. This provides a method for creating unique surface features via a mold release layer. Therefore, applying such pre-designed surface textures applied to the intermediate elements or mold can allow for the fabrication of encapsulant optical elements with both unique geometries and specific surface roughness, microlenses, or other features on the surfaces which are contacted by the intermediate material or mold. Regular and irregular patterns of microstructure can be integrally embossed by using a release film as a molding tool for microstructures. Many examples of microlens arrays are known in the prior art. Examples of regular patterns would be prisms, pyramids, hemispheres ("dots"), cubes and the like, so long as the shapes will demold from the patterned release film. The use of these structures on the surface of a packaged LED's encapsulant may help increase light extraction efficiency or facilitate optical beam shaping.

Next, in step 220, the intermediate elements 104 and release film 130 are placed on the mold 108. These may be placed and aligned using any suitable methods. The release film may be applied or attached by any method including coating, spraying, placement by a suction/blowing system, being pressed on, or any other attachment, application or holding method. Any alignment method may be used such as a self aligning pin arrangement or any other suitable arrangement. The intermediate elements may be formed and applied by any of the methods described previously or any other suitable method. These intermediate elements 104 may include any features to form the lens or encapsulant material or other light extraction, mechanical, or aesthetic features.

Figure 26:
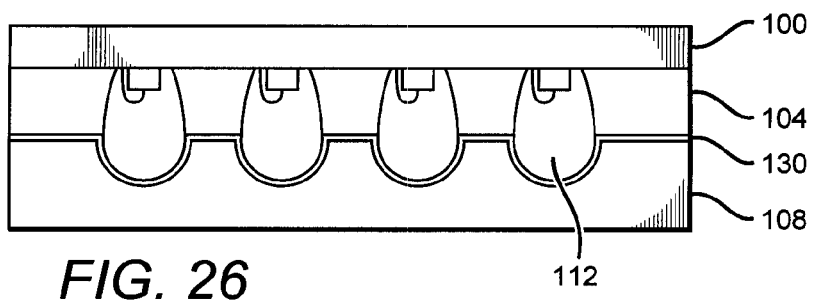
FIG. 26 is a side view of one embodiment of completion of the structure of FIG. 25 according the present invention.

Next, in step 222, the encapsulant or lens material 112 is dispensed in cavity 110. The lens material may be any suitable optically transparent material such as silicone, an epoxy, or a hybrid silicone/epoxy. A hybrid may be used to achieve a matching coefficient of thermal expansion. The lens material 112 may be dispensed by any suitable method such as by the use of a dispensing tip 302. In some embodiments the lens material may be filled to a level within the cavity 110, filling the cavity 100, or in other embodiments it may be filled over the capacity of the cavity. Once the lens material is dispensed, in step 224 the mount surface 100 with elements 102 is placed over the lens material 112 as shown in FIG. 26. In some embodiments the encapsulant or lens material may be injected or otherwise introduced into the cavity 110.

Figure 27:
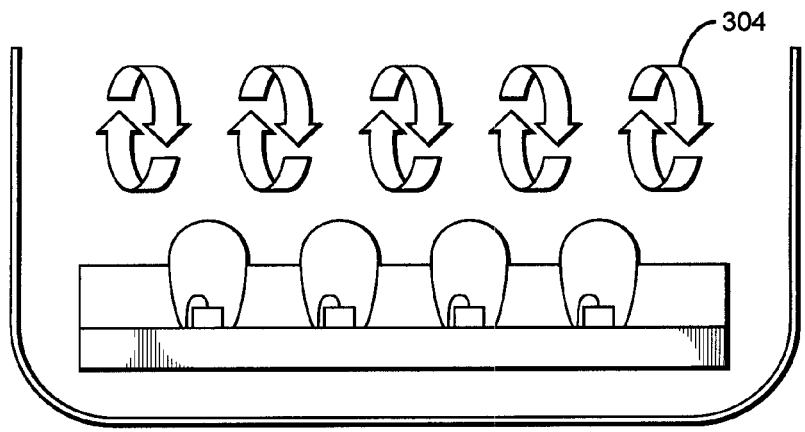
FIG. 27 is a side view of the structure of FIG. 26 placed in solvent in one embodiment of a removal process according to the present invention.

Following the dispensing of the lens material and placement of the mount surface, in step 212 the lens material is allowed to at least partially cure. After the lens material is allowed to at least partially cure the mold is removed 226. Next, if any portion of the intermediate elements is to be removed, it is removed in step 214. Removal may be clone by any of the processes described previously or any other suitable removal method. FIG. 27 shows one embodiment of the completed packages 300, including the substrate 100 with elements 102, intermediate elements 104, and at least partially cured lens material 112, immersed in a solvent 304 to remove the sacrificial portions.

Figure 28:
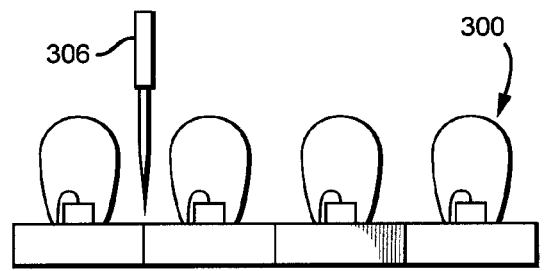
FIG. 28 is a side view of one embodiment of a package separation process according to the present invention.

After the sacrificial portions, if any, are removed, the process may continue in step 216 where the packages 300 on substrate 100 can be singulated using any appropriate method including dicing by dicing blade 306 as shown in FIG. 28.

Figure 30:
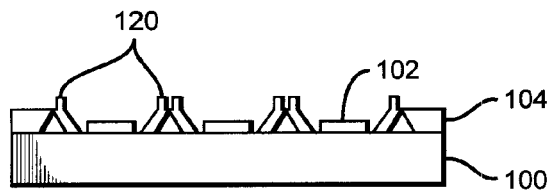
FIG. 30 is a side view of one embodiment of a surface with elements and intermediate material according to the present invention.
Figure 31:
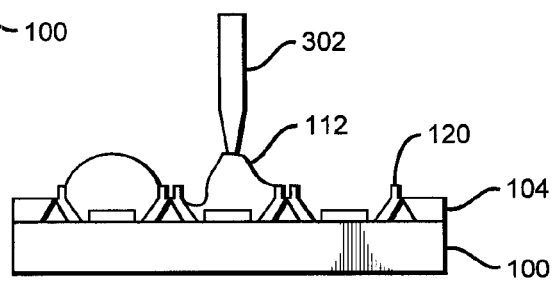
FIG. 31 is a side view of one embodiment of an encapsulant dispense process over the structure of FIG. 30 according to the present invention.
Figure 32:
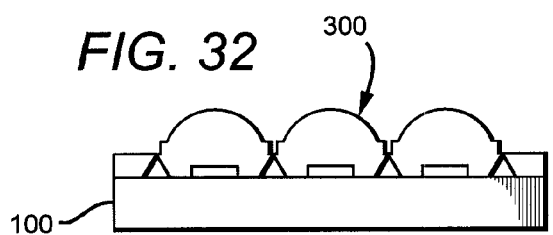
FIG. 32 is a side view of one embodiment of completed optics formed from the structure of FIG. 31 according to the present invention.

As described above in reference to FIGS. 17-19, a non-sacrificial intermediate layer may be used in conjunction with a molding process whereby at least a portion of the intermediate layer remains following fabrication of the primary optic. Similarly, as illustrated in FIGS. 30-32, a non-sacrificial intermediate layer may also be used in conjunction with a dispense process to fabricate the primary optical element. In these embodiments, the intermediate layer may contain a meniscus feature 120, as previously discussed with regard to FIGS. 4-10, typically an edge-type feature which serves to limit the lateral spread of the primary optic encapsulant material during dispense. FIGS. 30-32 show a process according to FIG. 21 of creating primary optics for LEDs or LED packages by providing a surface 100, with elements or LEDs 102 mounted on the surface 100. Intermediate elements 104 are then provided over the surface 100 and these intermediate elements 104 include meniscus creating features 120. Next, lens material 112 is dispensed over the LEDs 102 and at least partially cured.

In other embodiments a support element may be disposed surrounding an optical element to provide mechanical support or protect the optical element from damage. A support element may be comprised of any suitable material including plastics. The support ring may be formed at least in part by a permanent portion of an intermediate element and comprised of any of the materials suitable for an intermediate element. For example, the permanent portion of the intermediate layer shown in FIG. 19 or 32 may provide support and protection of at least a portion of the primary optic—even in cases where the encapsulant material delaminates from the intermediate material thereby providing a gap between the encapsulant and intermediate layer.

Figure 33:
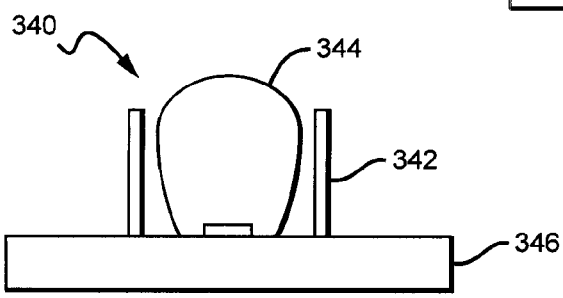
FIG. 33 is a side view of one embodiment of completed optics formed with a support ring according to the present invention

In one embodiment of package 340 illustrated in FIG. 33, a support ring 342 can be include which surrounds the optic 344 and is mounted on or attached to the substrate 346. In some embodiments, the support ring 342 can comprise a tube, although the support ring 342 can take many other shapes and can be many different sizes. The support ring 342 can be in physical contact with the optic 344 at least one point to provide support—for example, to prevent the optic from deflecting due to momentum if the part is dropped or to provide mechanical support for the primary optic (particularly larger, more massive optics; with respect to deflection due to gravity when the package is mounted at different angles. A support ring 342 may also prevent shearing of the optic due to accidental contact or impacts. Alternately, a gap could exist between the ring 342 and optic 344 such that the ring 342 primarily limits, but does not completely prevent, deflection of the optic 344 when dropped and/or prevents objects (e.g., fingers) from bumping into the optic 344 and causing deflection and subsequent damage.

The support ring 342 could also serve to limit contamination (dust, fingerprints, etc.) on the outside surface of the optic. This would be advantageous in the case of TIR optics where changes to the index of refraction on the outside surface of the optic would change the optical properties of the surface and could lead to scattering or light leakage. Other geometries of supports may also be used such as a ring supported by one or more 'legs' or posts or simply three or more legs surrounding the optic would also work. These legs or posts may have a cylindrical, rectangular, or other type of cross-sectional shape. In some embodiments, because the light is reflected at the internal surface of the optic, it will generally not interact with the support. However, in other embodiments, if an optic utilizing total internal reflection is used, the reflection depends on the difference in index of refraction between the interior and exterior surface of the optic. Thus a support which touches a total-internal-reflection optic would define the index of refraction on the exterior of the optic at the point of contact. For this reason, it may be beneficial to limit the area of contact between supports and TIR optics unless the index of refraction of the support is suitable.

Figure 34:
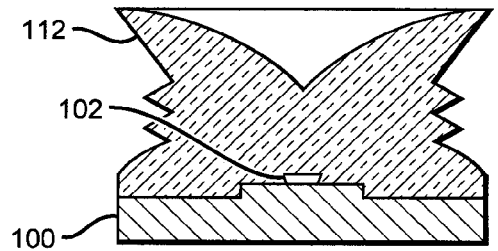
FIG. 34 is a cross-sectional view of one embodiment of an optic fabricated from a process according to the present invention.
Figure 35:
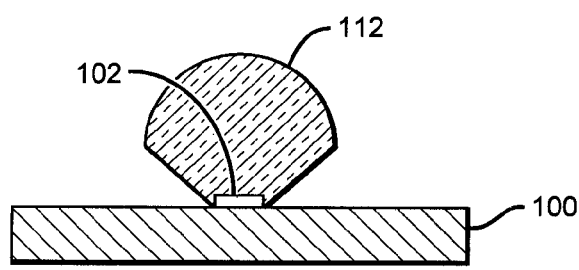
FIG. 35 is a cross-sectional view of another embodiment of an optic fabricated from a process according to the present invention.
Figure 36:
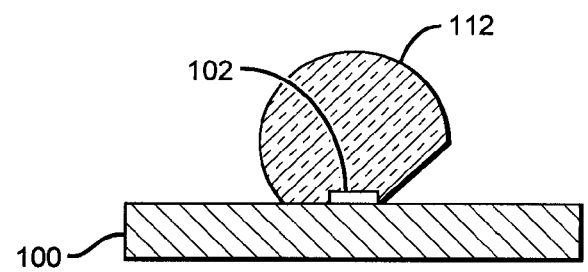
FIG. 36 is a cross-sectional view of another embodiment of an optic fabricated from a process according to the present invention.

Different embodiments of the fabrication processes discussed herein can be used to produce different embodiments of optical elements such as those seen in FIGS. 1A, 1B, 3a-3f, 10, 13, 16a, 16b, 19, 28, 32, 35-39. However, the type and shape of optical element is not limited to those shown here, any type or shape of optical element may be fabricated using these methods. In some embodiments, asymmetric lenses may be produced (FIG. 36), in other embodiments undercuts may be required (FIG. 35), and in yet other embodiments side-emitting optics may be desired (FIG. 34). Some applications may require substantially all light to be directed at a wide angle, approaching or somewhat exceeding 90°, with little or no light at forward angles. In order to obtain a wide angle distribution of light from an LED package, a side-directing lens configured to redirect light must be incorporated in the LED package. Such a lens may be fabricated using the methods discussed above, such as the processes in FIGS. 20, 21 and 29. FIG. 34 illustrates one such lens. The lens includes a sawtooth, refractive portion and a top funnel portion. The sawtooth portion is intended to refract and bend light so that the light exits the lens close to 90° with respect to the longitudinal axis of the LED. Using traditional lens fabrication methods, the sawtooth feature of this lens would make the lens difficult to manufacture. For example, during a traditional injection molding process, the undercuts of the sawtooth feature would necessitate a side action injection mold. These sawtooth features may be fabricated in accordance with embodiments herein. For example, intermediate elements may be stacked, similarly to FIGS. 14-16b, such that the encapsulant would take the sawtooth shape shown. Next, after at least partially curing the encapsulant, the intermediate elements may be removed without damaging the lens or any surrounding areas or materials, without the use of side action molds. In additional, shaping of the top facing surface may be accomplished through molds or release films on molds.

It is important to note that the optic shape created by the methods described above may be shaped for mechanical reasons, optical reasons, aesthetic reasons, or a combination of any of these. Embodiments described herein can be applied to wafer level processes.

We claim:

1. A light emitter package, comprising:
a light emitter disposed on a surface;
at least one intermediate element on said surface at least partially surrounding said light emitter, each of said intermediate elements configured such that at least a portion of said intermediate element can be removed; and
an encapsulant over said light emitter forming a primary optic, said at least one intermediate element at least partially defining the shape of said primary optic.

2. The light emitter package of claim 1, wherein said primary optic is capable of beam shaping.

3. The light emitter package of claim 1, wherein said light emitter comprises an LED.

4. The light emitter package of claim 1, wherein said intermediate element includes a meniscus forming feature.

5. The light emitter package of claim 1, wherein said primary optic comprises an exit face and has a tapered shape such that at least a portion closer to the base of said primary optic is narrower than at least a portion of the exit face.

6. The light emitter package of claim 1, wherein said primary optic comprises an overhang portion.

7. The light emitter package of claim 1, wherein said primary optic comprises an asymmetrical shape.

8. The light emitter package of claim 1, wherein said primary optic includes wavelength conversion material.

9. The light emitter package of claim 1, further comprising a wavelength conversion material over said primary optic.

10. The light emitter package of claim 1, wherein said intermediate element includes a wavelength conversion material.

11. The light emitter package of claim 1, wherein said intermediate element is comprised of a material which is sacrificial.

12. The light emitter package of claim 11 wherein said material is selected from the group consisting of thermoplastic polymers, polyvinyl alcohol, wax, and soluble plastics.

13. The light emitter package of claim 1, wherein said intermediate element is permanent.

14. The light emitter package of claim 1, further comprising a secondary optic over said primary optic.

15. The light emitter package of claim 1, wherein said intermediate element further comprises an air gap within said intermediate element.

16. The light emitter package of claim 1, wherein at least a portion of said intermediate element is reflective.

17. An array of light emitter packages, comprising:
a plurality of light emitters disposed on a surface;
at least one intermediate element on said surface at least partially surrounding said light emitters, each of said intermediate elements configured such that at least a portion of said intermediate element can be removed; and
an encapsulant over each of said light emitters forming primary optics, said at least one intermediate element at least partially defining the shape of said primary optics.

18. The array of light emitter packages of claim 17, wherein at least some of said plurality of light emitters comprise LEDs.

19. The array of light emitter packages of claim 17, wherein said intermediate element includes a plurality of meniscus forming features.

20. The array of light emitter packages of claim 17, wherein said primary optics have an exit face and have a tapered shape such that at least a portion closer to the base of said primary optics is narrower than at least a portion closer to the exit face.

21. The array of light emitter packages of claim 17 wherein said primary optics comprise an overhang portion.

22. The array of light emitter packages of claim 17, wherein said primary optics comprise an asymmetrical shape.

23. The array of light emitter packages of claim 17, further comprising a wavelength conversion material.

24. The array of light emitter packages of claim 17, wherein said intermediate element is comprised of a material which is sacrificial.

25. The array of light emitter packages of claim 17, wherein said intermediate element is permanent.

26. The array of light emitter packages of claim 17, wherein said intermediate element further comprises an air gap within said intermediate element.

27. The array of light emitter packages of claim 17, wherein at least a portion of said intermediate element is reflective.

* * * * *

UNITED STATES PATENT AND TRADEMARK OFFICE
CERTIFICATE OF CORRECTION

| | | |
|---|---|---|
| PATENT NO. | : 8,564,004 B2 | Page 1 of 1 |
| APPLICATION NO. | : 13/306589 | |
| DATED | : October 22, 2013 | |
| INVENTOR(S) | : Eric Tarsa et al. | |

It is certified that error appears in the above-identified patent and that said Letters Patent is hereby corrected as shown below:

In the Specification:

In column 14, line 59, please change Patent No. 7,286,926 to U.S. Patent No. 7,286,296

Signed and Sealed this
First Day of July, 2014

Michelle K. Lee
*Deputy Director of the United States Patent and Trademark Office*